(12) United States Patent
Guo et al.

(10) Patent No.: US 11,201,154 B2
(45) Date of Patent: Dec. 14, 2021

(54) METHODS OF FORMING AN APPARATUS INCLUDING DEVICE STRUCTURES INCLUDING PILLAR STRUCTURES, AND RELATED MEMORY DEVICES, AND ELECTRONIC SYSTEMS

(71) Applicant: Micron Technology, Inc., Boise, ID (US)

(72) Inventors: Song Guo, Boise, ID (US); Sanh D. Tang, Meridian, ID (US); Shen Hu, Boise, ID (US); Yan Li, Boise, ID (US); Nicholas R. Tapias, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 75 days.

(21) Appl. No.: 16/729,076

(22) Filed: Dec. 27, 2019

(65) Prior Publication Data

US 2021/0202487 A1 Jul. 1, 2021

(51) Int. Cl.
G11C 11/24 (2006.01)
H01L 27/108 (2006.01)
G11C 11/408 (2006.01)

(52) U.S. Cl.
CPC .... H01L 27/10811 (2013.01); G11C 11/4087 (2013.01); H01L 27/1085 (2013.01); H01L 27/10885 (2013.01); H01L 27/10891 (2013.01)

(58) Field of Classification Search
CPC .......... H01L 27/10811; H01L 27/1085; H01L 27/10891; H01L 27/10885; G11C 11/4087

USPC ........................................................ 365/149
See application file for complete search history.

(56) References Cited

U.S. PATENT DOCUMENTS

| | | | |
|---|---|---|---|
| 5,753,961 A | 5/1998 | Tsuchiaki | |
| 6,429,068 B1 | 8/2002 | Divakaruni et al. | |
| 7,781,285 B2 | 8/2010 | Kim et al. | |
| 8,372,724 B2 | 2/2013 | Takiaishi | |
| 8,987,796 B2 | 3/2015 | MiKasa et al. | |
| 9,041,099 B2 | 5/2015 | Surthi et al. | |
| 9,564,442 B2 | 2/2017 | Tang et al. | |
| 9,589,962 B2 | 3/2017 | Tang et al. | |
| 9,881,924 B2 | 1/2018 | Wang et al. | |
| 9,960,114 B1 | 5/2018 | Dhir et al. | |
| 2011/0198679 A1 | 8/2011 | Ikebuchi et al. | |
| 2013/0087842 A1 | 4/2013 | Kim et al. | |
| 2016/0300842 A1* | 10/2016 | Tang | H01L 21/02068 |
| 2018/0061840 A1* | 3/2018 | Sills | H01L 28/60 |
| 2018/0350611 A1 | 12/2018 | Kim et al. | |

(Continued)

OTHER PUBLICATIONS

U.S. Appl. No. 16/379,085 titled Semiconductor Structure Formation filed Sep. 9, 2019.

*Primary Examiner* — Hoai V Ho
*Assistant Examiner* — Minh Dinh
(74) *Attorney, Agent, or Firm* — TraskBritt

(57) ABSTRACT

A method of forming an apparatus comprises forming pillar structures extending from a base material. Upper portions of the pillar structures may exhibit a lateral width that is relatively greater than a lateral width of lower portions of the pillar structures. The method also comprises forming access lines laterally adjacent to the lower portions of the pillar structures and forming digit lines above upper surfaces of the pillar structures. Memory devices and electronic systems are also described.

21 Claims, 9 Drawing Sheets

(56) References Cited

U.S. PATENT DOCUMENTS

2019/0027604 A1 1/2019 Lee et al.
2019/0131306 A1 5/2019 Lee et al.
2019/0198668 A1 6/2019 Tang et al.

* cited by examiner

METHODS OF FORMING AN APPARATUS INCLUDING DEVICE STRUCTURES INCLUDING PILLAR STRUCTURES, AND RELATED MEMORY DEVICES, AND ELECTRONIC SYSTEMS

TECHNICAL FIELD

Embodiments disclosed herein relate to microelectronic devices and microelectronic device fabrication. More particularly, embodiments of the disclosure relate to methods of forming an apparatus including device structures including pillar structures having upper portions that are relatively greater in width than lower portions thereof, and to related memory devices, and electronic systems.

BACKGROUND

Semiconductor device designers often desire to increase the level of integration or density of features within a microelectronic device by reducing the dimensions of the individual features and by reducing the separation distance between neighboring features. In addition, semiconductor device designers often desire to design architectures that are not only compact, but offer performance advantages, as well as simplified designs.

A relatively common semiconductor device is a memory device. A memory device may include a memory array having a number of memory cells arranged in a grid pattern. One type of memory cell is a dynamic random access memory (DRAM). In the simplest design configuration, a DRAM cell includes one access device, such as a transistor, and one storage device, such as a capacitor. Modern applications for memory devices can utilize vast numbers of DRAM unit cells, arranged in an array of rows and columns. The DRAM cells are electrically accessible through digit lines and word lines arranged along the rows and columns of the array.

Reducing the dimensions and spacing of memory device features places ever increasing demands on the methods used to form the memory device features. For example, one of the limiting factors in the continued shrinking of memory devices is the resistance of the contacts associated therewith. As used herein, a "contact" refers to a connection facilitating a conductive pathway between at least two structures. For example, in a DRAM device exhibiting a dual bit memory cell structure, a digit line contact is provided between a digit line and an access device (e.g., a transistor) formed in or above a substrate, and storage node contacts are formed between the access device and a storage node (e.g., a capacitor) where electrical charge may be stored.

With recent advances of semiconductor manufacturing techniques, design rules are getting smaller and smaller for semiconductor devices. As a result, alignment margin is difficult to secure, especially when aligning contacts between closely spaced conductive lines. As semiconductor devices become highly integrated, a contact margin between a digit line contact plug and a digit line contact area have been decreased, creating misalignment or overlay issues, for example, cell contact to digit line contact overlay, digit line to digit line contact overlay, and storage node to cell contact overlay.

Further, as the landing areas for forming the digit line contact and cell contact become smaller and smaller because of the shrinking active areas in the memory array, the contact resistance increases dramatically, especially when misalignment occurs. Increased contact resistance decreases the drive current of the memory device, which can adversely affect memory device performance.

DETAILED DESCRIPTION

Figure 1A:
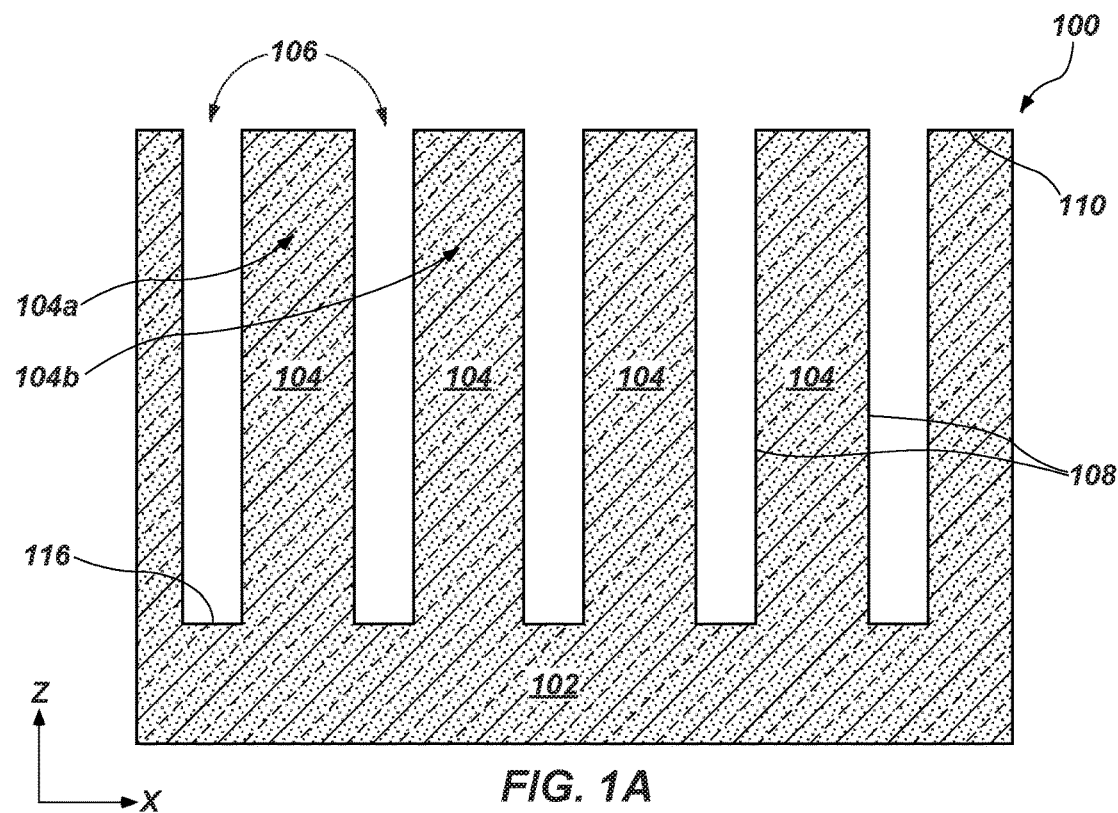
FIGS. 1A through 1I are simplified partial cross-sectional (FIGS. 1A, 1C, 1D, 1E, 1F, 1G, and 1H) and simplified partial top-down (FIGS. 1B and 1I) views illustrating a method of forming an apparatus including a device structure, in accordance with embodiments of the disclosure, where the top-down views of FIGS. 1A and 1H are taken along lines A-A and H-H in FIGS. 1B and 1I, respectively.

Methods of forming an apparatus (e.g., a microelectronic device, a semiconductor device) including device structures including pillar structures having upper portions that are relatively greater in width than lower portions thereof are described herein, as are related memory devices and electronic systems. In some embodiments, a method of forming an apparatus comprises forming pillar structures extending from a base material. Upper portions of the pillar structures may exhibit a lateral width that is relatively greater than a lateral width of lower portions of the pillar structures. The method also comprises forming access lines (e.g., word lines) laterally adjacent to the lower portions of the pillar structures and forming digit lines (e.g., bit lines) above upper surfaces of the pillar structures. In some embodiments, the upper portions of the pillar structures may be formed by an initial material removal (e.g., etch) act and the lower portions of the pillar structures may be formed by one or more additional material removal (e.g., etch) act. In particular, openings may be formed extending vertically between the pillar structures and material may be removed from exposed side surfaces of the pillar structures. In other embodiments, the lower portions of the pillar structures may be formed by forming openings between adjacent pillar structures in a first act, and the upper portions of the pillar structures may be formed by forming a precursor material over exposed upper ends of the lower portions of the pillar structures and processing the precursor material to form a semiconductive material (e.g., a semiconductive material substantially similar to that of the lower portions of the pillar structures) in a second, subsequent act. The methods of the disclosure may facilitate increased reliability and performance in microelectronic device structures (e.g., DRAM device structures, such as DRAM cells), microelectronic devices (e.g., DRAM devices), and electronic systems that rely on high feature density.

The following description provides specific details, such as material compositions and processing conditions, in order to provide a thorough description of embodiments of the disclosure. However, a person of ordinary skill in the art would understand that the embodiments of the disclosure may be practiced without employing these specific details. Indeed, the embodiments of the disclosure may be practiced in conjunction with conventional fabrication techniques employed in the semiconductor industry. In addition, the description provided below does not form a complete process flow for manufacturing an apparatus. The structures described below do not form a complete microelectronic device. Only those process stages (e.g., acts) and structures necessary to understand the embodiments of the disclosure are described in detail below. Additional stages to form a complete microelectronic device may be performed by conventional fabrication techniques.

The materials described herein may be formed by conventional techniques including, but not limited to, spin coating, blanket coating, chemical vapor deposition (CVD), atomic layer deposition (ALD), plasma enhanced ALD, or physical vapor deposition (PVD). Alternatively, the materials may be grown in situ. Depending on the specific material to be formed, the technique for depositing or growing the material may be selected by a person of ordinary skill in the art. The removal of materials may be accomplished by any suitable technique including, but not limited to, etching, abrasive planarization (e.g., chemical-mechanical planarization), or other known methods unless the context indicates otherwise.

Drawings presented herein are for illustrative purposes only, and are not meant to be actual views of any particular material, component, structure, device, or system. Variations from the shapes depicted in the drawings as a result, for example, of manufacturing techniques and/or tolerances, are to be expected. Thus, embodiments described herein are not to be construed as being limited to the particular shapes or regions as illustrated, but include deviations in shapes that result, for example, from manufacturing. For example, a region illustrated or described as box-shaped may have rough and/or nonlinear features, and a region illustrated or described as round may include some rough and/or linear features. Moreover, sharp angles that are illustrated may be rounded, and vice versa. Thus, the regions illustrated in the figures are schematic in nature, and their shapes are not intended to illustrate the precise shape of a region and do not limit the scope of the present claims. The drawings are not necessarily to scale. Additionally, elements common between figures may retain the same numerical designation.

As used herein, the singular forms "a," "an," and "the" are intended to include the plural forms as well, unless the context clearly indicates otherwise.

As used herein, "and/or" includes any and all combinations of one or more of the associated listed items.

As used herein, "about" or "approximately" in reference to a numerical value for a particular parameter is inclusive of the numerical value and a degree of variance from the numerical value that one of ordinary skill in the art would understand is within acceptable tolerances for the particular parameter. For example, "about" or "approximately" in reference to a numerical value may include additional numerical values within a range of from 90.0 percent to 110.0 percent of the numerical value, such as within a range of from 95.0 percent to 105.0 percent of the numerical value, within a range of from 97.5 percent to 102.5 percent of the numerical value, within a range of from 99.0 percent to 101.0 percent of the numerical value, within a range of from 99.5 percent to 100.5 percent of the numerical value, or within a range of from 99.9 percent to 100.1 percent of the numerical value.

As used herein, spatially relative terms, such as "beneath," "below," "lower," "bottom," "above," "upper," "top," "front," "rear," "left," "right," and the like, may be used for ease of description to describe one element's or feature's relationship to another element(s) or feature(s) as illustrated in the figures. Unless otherwise specified, the spatially relative terms are intended to encompass different orientations of the materials in addition to the orientation depicted in the figures. For example, if materials in the figures are inverted, elements described as "below" or "beneath" or "under" or "on bottom of" other elements or features would then be oriented "above" or "on top of" the other elements or features. Thus, the term "below" can encompass both an orientation of above and below, depending on the context in which the term is used, which will be evident to one of ordinary skill in the art. The materials may be otherwise oriented (e.g., rotated 90 degrees, inverted, flipped) and the spatially relative descriptors used herein interpreted accordingly.

As used herein, the terms "vertical," "longitudinal," "horizontal," and "lateral" are in reference to a major plane of a structure and are not necessarily defined by Earth's gravitational field. A "horizontal" or "lateral" direction is a direction that is substantially parallel to the major plane of the structure, while a "vertical" or "longitudinal" direction is a direction that is substantially perpendicular to the major plane of the structure. The major plane of the structure is defined by a surface of the structure having a relatively large area compared to other surfaces of the structure.

As used herein, the term "configured" refers to a size, shape, orientation, and arrangement of one or more of at least one structure and at least one apparatus facilitating operation of one or more of the structure and the apparatus in a pre-determined way.

As used herein, the term "pitch" refers to a distance between identical points in two adjacent (i.e., neighboring) features.

As used herein, reference to an element as being "on" or "over" another element means and includes the element being directly on top of, directly adjacent to (e.g., directly laterally adjacent to, directly vertically adjacent to), directly underneath, or in direct contact with the other element. It also includes the element being indirectly on top of, indirectly adjacent to (e.g., indirectly laterally adjacent to, indirectly vertically adjacent to), indirectly underneath, or near the other element, with other elements present therebetween. In contrast, when an element is referred to as being "directly on" or "directly adjacent to" another element, there are no intervening elements present.

As used herein, the term "apparatus" includes without limitation a memory device, as well as other microelectronic devices (e.g., semiconductor devices) which may or may not incorporate memory, such as a logic device, a processor device, or a radiofrequency (RF) device. Further, the apparatus may incorporate memory in addition to other functions such as, for example, a so-called "system on a chip" (SoC) including a processor and memory, or an apparatus including logic and memory. The apparatus may be a three-dimensional (3D) microelectronic device including, but not limited to, a 3D NAND Flash memory device, such as a 3D floating gate NAND Flash memory device or a 3D replacement gate NAND Flash memory device.

As used herein, the term "substantially" in reference to a given parameter, property, or condition means and includes to a degree that one of ordinary skill in the art would understand that the given parameter, property, or condition is met with a degree of variance, such as within acceptable tolerances. By way of example, depending on the particular parameter, property, or condition that is substantially met, the parameter, property, or condition may be at least 90.0 percent met, at least 95.0 percent met, at least 99.0 percent met, at least 99.9 percent met, or even 100.0 percent met.

As used herein, the term "substrate" means and includes a material (e.g., a base material) or construction upon which additional materials are formed. The substrate may be a semiconductor substrate, a base semiconductor material on a supporting structure, a metal electrode, or a semiconductor substrate having one or more materials, layers, structures, or regions formed thereon. The materials on the semiconductor substrate may include, but are not limited to, semiconductive materials, insulating materials, conductive materials, etc. The substrate may be a conventional silicon substrate or other bulk substrate comprising a layer of semiconductive material. As used herein, the term "bulk substrate" means and includes not only silicon wafers, but also silicon-on-insulator ("SOI") substrates, such as silicon-on-sapphire ("SOS") substrates and silicon-on-glass ("SOG") substrates, epitaxial layers of silicon on a base semiconductor foundation, and other semiconductor or optoelectronic materials, such as silicon-germanium, germanium, gallium arsenide, gallium nitride, and indium phosphide. The substrate may be doped or undoped.

FIGS. 1A through 1I are simplified partial cross-sectional (FIGS. 1A, 1C, 1D, 1E, 1F, 1G, and 1H) and simplified partial top-down (FIGS. 1B and 1I) views illustrating embodiments of a method of forming a microelectronic device structure (e.g., a memory device structure, such as a DRAM device structure) for a microelectronic device (e.g., a memory device, such as a DRAM device) at various stages of the method. With the description provided below, it will be readily apparent to one of ordinary skill in the art that the methods described herein may be used in various devices. In other words, the methods of the disclosure may be used whenever it is desired to form a microelectronic device.

Figure 1B:
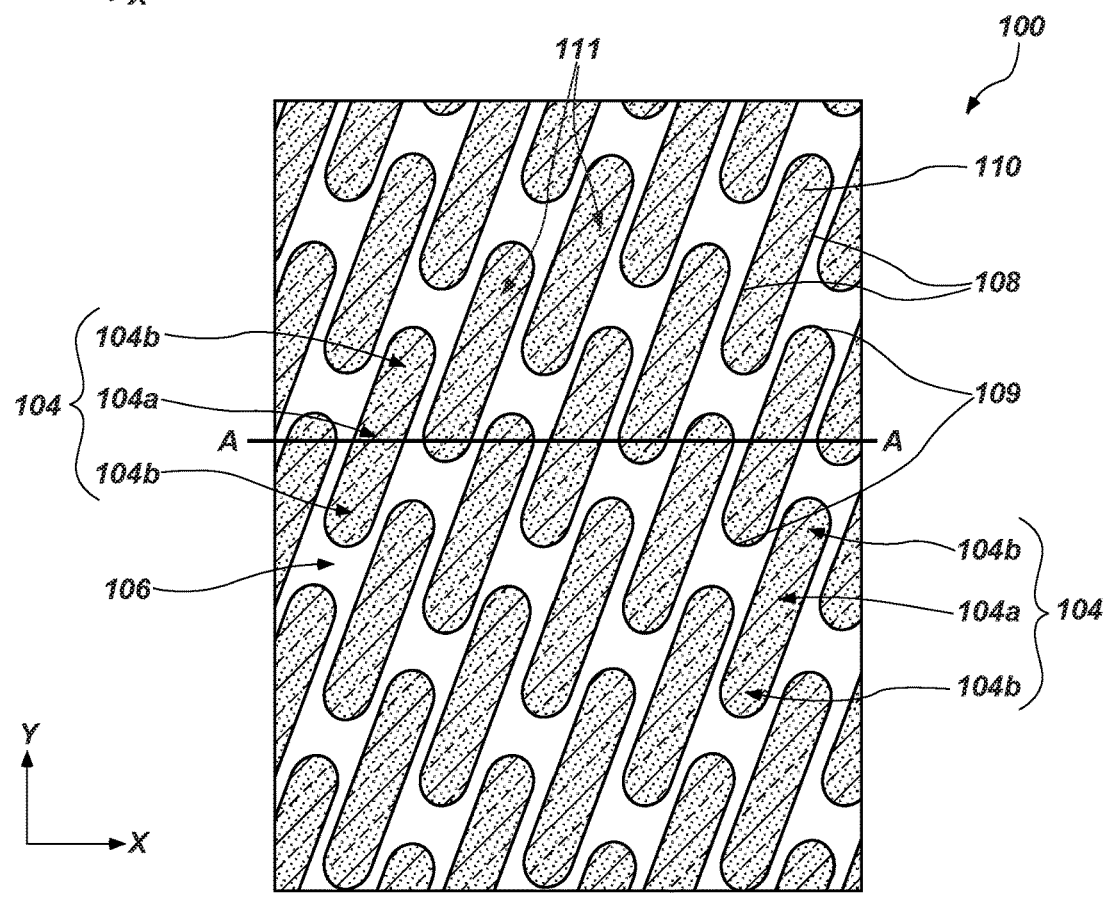

Referring to FIG. 1A, a partially fabricated device structure 100 for use in an apparatus (e.g., an electronic device, a memory device) is shown. The device structure 100 includes a base material 102 (e.g., a semiconductive material), pillar structures 104 longitudinally extending from and integral with the base material 102, and openings 106 extending vertically between the pillar structures 104. As used herein, each of the terms "longitudinal" and "vertical" means and includes extending in a direction (e.g., a Z-direction) substantially perpendicular to the base material 102, regardless of the orientation of the base material 102. Accordingly, as used herein, each of the terms "lateral" and "horizontal" means and includes extending in a direction substantially parallel to the base material 102, regardless of the orientation of the base material 102. FIG. 1B is a top-down view of the device structure 100 at the processing stage shown in FIG. 1A, wherein a line A-A corresponds to the cross-section of the device structure 100 depicted in FIG. 1A. As shown in FIG. 1B, the line A-A may extend in a first lateral direction (e.g., an X-direction) offset from a direction running perpendicular to a second lateral direction (e.g., a Y-direction) in which the pillar structures 104 extend, such as a direction greater than zero (0) degrees and less than or equal to about ninety (90) degrees relative to the first lateral direction, such as within a range of from about ten (10) degrees to about eighty (80) degrees, from about thirty (30) degrees to about seventy-five (75) degrees, or from about forty (40) degrees to about seventy (70) degrees. In some embodiments, the direction relative to the first lateral direction may be about twenty-one (21) degrees offset from a direction extending perpendicular to the direction in which the pillar structures 104 extend. Stated another way, the pillar structures 104 may extend at an acute angle in a lateral direction that is non-orthogonal (e.g., non-perpendicular) to a lateral direction in which each of the word lines and the digit lines extends.

The base material 102 and the pillar structures 104 may each be formed of and include a semiconductive material including, but not limited to, at least one of a silicon material, a silicon-germanium material, a germanium material, a gallium arsenide material, a gallium nitride material, and an indium phosphide material. In some embodiments, the base material 102 and the pillar structures 104 are formed of and include at least one silicon material. As used herein, the term "silicon material" means and includes a material that includes elemental silicon or a chemical compound containing silicon atoms. The base material 102 and the pillar structures 104 may, for example, be formed of and include monocrystalline silicon, polysilicon, or combinations thereof.

Referring collectively to FIGS. 1A and 1B, each of the pillar structures 104 may exhibit an elongate lateral cross-sectional shape (see FIG. 1B), such as an oblong lateral cross-sectional shape. The pillar structures 104 may each include opposing sidewalls 108, opposing ends 109 (FIG. 1B), and an upper surface 110. The upper surfaces 110 of the pillar structures 104 may share a common plane (e.g., the upper surfaces 110 of the pillar structures 104 may be substantially coplanar with one another). In addition, as shown in FIG. 1B, each of the pillar structures 104 may include a digit line contact region 104a and storage node contact regions 104b (e.g., cell contact regions, contact pad). The storage node contact regions 104b may be located proximate the opposing ends 109 of each of the pillar structures 104, and the digit line contact region 104a may be located between the storage node contact regions 104b and proximate a center of each of the pillar structures 104. The digit line contact region 104a and the storage node contact regions 104b of the pillar structures 104 may subsequently be separated from one another by isolation trenches having word lines formed therein, as described in further detail below. For neighboring (e.g., adjacent) pillar structures 104, the digit line contact region 104a of one of the neighboring pillar structures 104 may be located laterally adjacent to one of the storage node contact regions 104b of the other of the neighboring pillar structures 104.

As shown in FIGS. 1A and 1B, the pillar structures 104 may each exhibit substantially the same dimensions (e.g., length, width, height) and spacing. In additional embodiments, at least one of the pillar structures 104 may have at least one different dimension (e.g., a different length, a different width, a different height) than at least one other of the pillar structures 104, and/or the spacing between at least one pair of neighboring pillar structures 104 may be different than the spacing between at least one other pair of neighboring pillar structures 104. The dimensions and spacing of the pillar structures 104 may be selected to provide desired dimensions and spacing to one or more subsequently formed features (e.g., structures, spacers, contact plugs, digit lines) of the device structure 100, as described in further detail below. In some embodiments, each of the pillar structures 104 exhibits a minimum width of less than or equal to about 100 nanometers (nm) (e.g., between about 10 nm and about 20 nm), and a minimum distance (e.g., spacing) between neighboring pillar structures 104 is less than or equal to about 100 nm (e.g., between about 10 nm and about 20 nm).

With continued reference to FIGS. 1A and 1B, the pillar structures 104 are separated from one another by the openings 106. As shown in FIG. 1A, the openings 106 extend longitudinally from the upper surfaces 110 of the pillar structures 104 to an upper surface 116 of the base material 102. The height of the pillar structures 104 may correspond to a depth of the openings 106, and the minimum distance between neighboring pillar structures 104 may correspond to the minimum width of an opening 106 therebetween.

The device structure 100, including the base material 102, and the pillar structures 104 may be formed using conventional processes and conventional processing equipment, which are not described in detail herein. By way of non-limiting example, a semiconductive material may be conventionally formed and patterned (e.g., masked, photoexposed, developed, and etched) to form the base material 102, the pillar structures 104, and the openings 106, therebetween. In some embodiments, the pillar structures 104 of the device structure 100 may be formed using one or more (e.g., two) patterning processes, as described below with reference to FIGS. 1C through 1E.

Figure 1C:
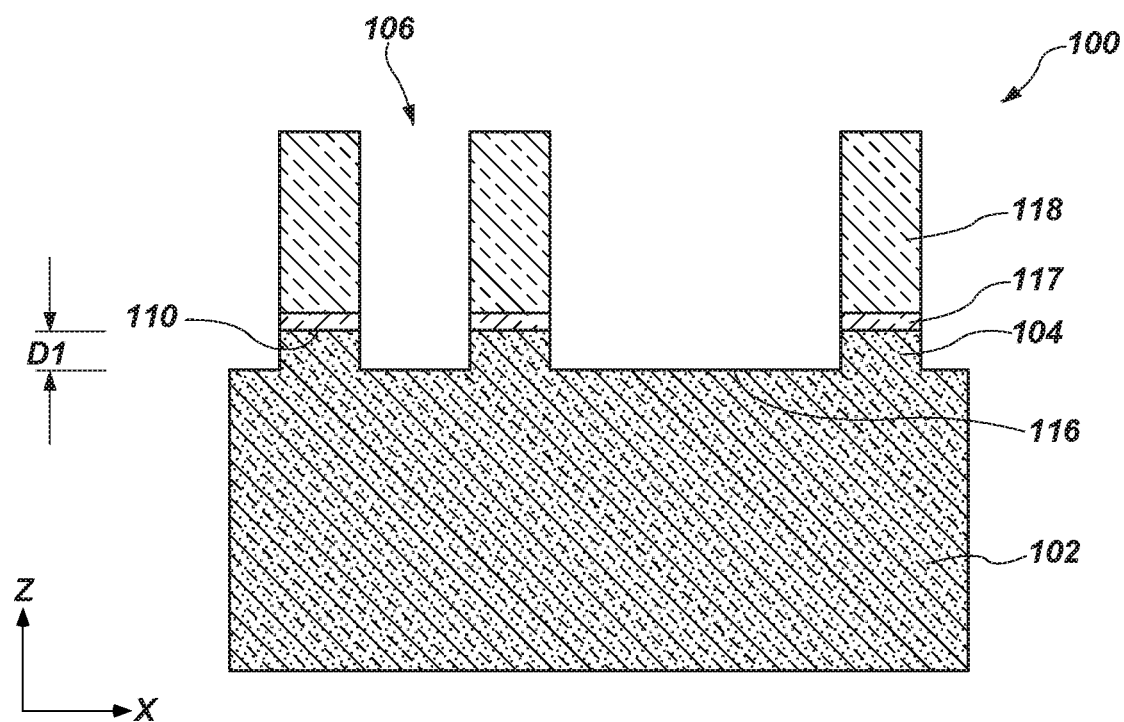

Referring to FIG. 1C, a barrier material 117 may, optionally, be formed adjacent to (e.g., on or over) exposed surfaces of the base material 102 to facilitate formation of the pillar structures 104, and a hard mask material 118 may be formed adjacent to (e.g., on or over) the barrier material 117. For example, a conventional method of forming contacts includes transferring a pattern of openings and features in a mask structure (not shown) into the hard mask material 118 overlying the base material 102, and then using the patterned hard mask material 118 to selectively remove (e.g., selectively etch, selectively dry etch) the underlying base material 102 in a first etch process to form the pillar structures 104 each including the two storage node contact regions 104b (FIG. 1B) and the digit line contact region 104a (FIG. 1B) laterally between the two storage node contact regions 104b. The base material 102 may be etched to a first depth $D_1$, as shown in FIG. 1C, prior to subsequent processing (e.g., additional etch processes), as described in further detail below. The first depth $D_1$ may correspond to a distance (e.g., in the Z-direction) between the upper surfaces 110 of the pillar structures 104 (e.g., an initial upper surface of the base material 102 prior to the first etch process) and an upper surface 116 of the base material 102 within the openings 106 (e.g., subsequent to the first etch process).

The barrier material 117 may be formed of and include at least one dielectric material. By way of non-limiting example, the barrier material 117 may be formed of and include at least one dielectric material including, but not limited to, silicon oxide or silicon nitride. For example, the barrier material 117 may be formed of a silicon dioxide material configured to be removed by a buffered oxide etching (BOE) process. In other embodiments, the barrier material 117 may be formed of and include an oxynitride material. The dielectric material of the barrier material 117 may be selectively etchable relative to the base material 102 and/or the hard mask material 118.

The hard mask material 118 may comprise at least one material suitable for use as an etch mask to pattern portions of the base material 102 following the patterning of the hard mask material 118. By way of non-limiting example, the hard mask material 118 may be formed of and include at least one of amorphous carbon, silicon, a silicon oxide, a silicon nitride, a silicon oxycarbide, aluminum oxide, and a silicon oxynitride. In some embodiments, the hard mask material 118 comprises at least one oxide dielectric material (e.g., one or more of silicon dioxide and aluminum oxide). The hard mask material 118 may be homogeneous (e.g., may comprise a single material), or may be heterogeneous (e.g., may comprise a stack including at least two different materials).

The barrier material 117 and the hard mask material 118 may each individually be formed using conventional processes and patterned using conventional patterning and material removal processes, such as conventional photolithographic exposure processes, conventional development processes, conventional etching) processes and conventional processing equipment, which are not described in detail herein. Following the material removal processes (e.g., selective etch processes) of the underlying base material 102 and formation of the pillar structures 104, at least portions of the barrier material 117, if present, and the hard mask material 118 may remain on the upper surfaces 110 of the pillar structures 104 while the upper surfaces 116 of the base material 102 within the openings 106 may be substantially free (e.g., substantially entirely free) of each of the barrier material 117 and the hard mask material 118, as shown in FIG. 1C.

Figure 1D:
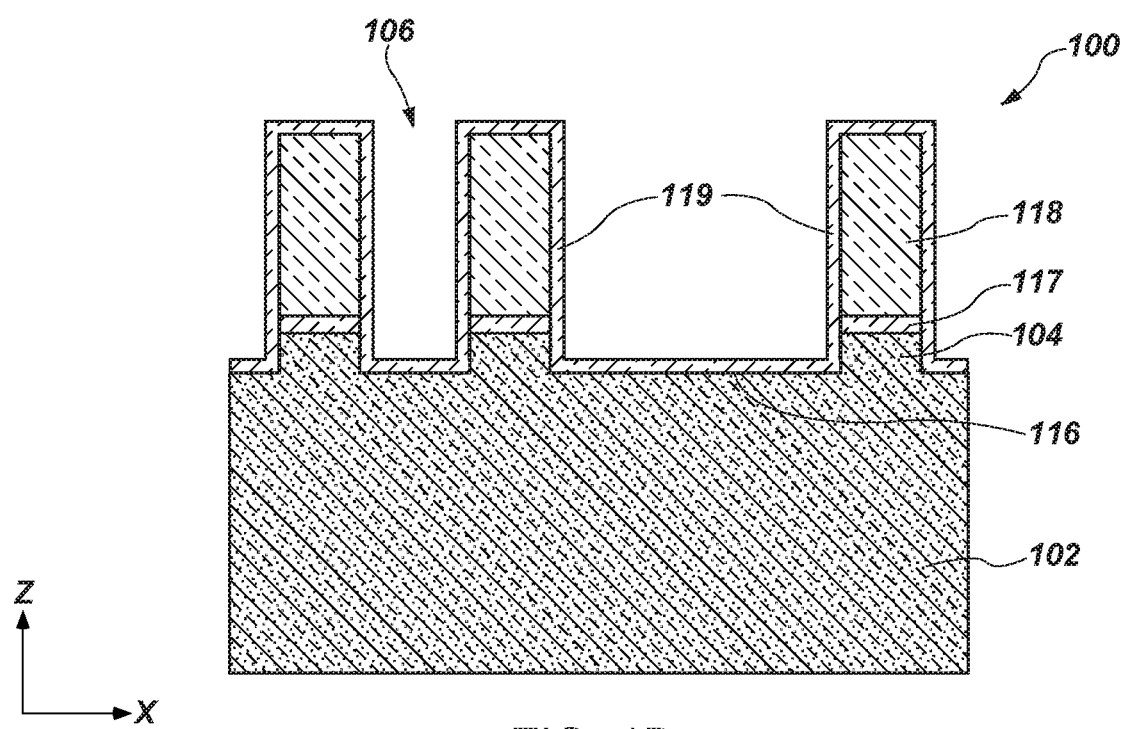

Referring to FIG. 1D, a liner 119 may be formed adjacent to (e.g., on or over) exposed surfaces of each of the base material 102 and the pillar structures 104, including the barrier material 117 and the hard mask material 118 thereover, to further facilitate formation of the pillar structures 104. For example, the liner 119 may be conformally formed on the upper surfaces 116 of the base material 102 within the openings 106, on exposed side surfaces and upper surfaces of the hard mask material 118, and on exposed side surfaces of each of the barrier material 117 and the pillar structures 104. In some embodiments, the liner 119 substantially surrounds the side surfaces (e.g., sidewalls) of the pillar structures 104. The liner 119 may be formed at any desirable thickness. For example, the liner 119 may be formed to a thickness that is less than about one-half of a distance between neighboring pillar structures 104. By way of non-limiting example, the liner 119 may be formed to a thickness of between about 1 nm and about 10 nm, such as between about 1 nm and about 5 nm, or between about 5 nm and about 10 nm. In some embodiments, the liner 119 may be formed to a thickness of about 4 nm. The thickness of the liner 119 may be substantially uniform along its length.

The liner 119 may be formed of and include at least one dielectric material, such as one or more of at least one dielectric oxide material (e.g., one or more of $SiO_x$, phosphosilicate glass, borosilicate glass, borophosphosilicate glass, fluorosilicate glass, $AlO_x$, $HfO_x$, $NbO_x$, and $TiO_x$), at least one dielectric nitride material (e.g., $SiN_y$), at least one dielectric oxynitride material (e.g., $SiO_xN_y$), at least one dielectric oxycarbide material (e.g., $SiO_xC_z$), at least one dielectric carboxynitride material (e.g., $SiO_xCzN_y$), and amorphous carbon. In some embodiments, the liner 119 comprises a silicon dioxide material. Further, the material of the liner 119 may be the same material as, or a different material than, the material of the barrier material 117 and/or the hard mask material 118.

The liner 119 may be formed using one or more conventional conformal deposition techniques, such as one or more of a conventional ALD process, a conventional conformal CVD process, and a conventional in situ growth process (e.g., in situ oxidation of a silicon material).

Figure 1E:
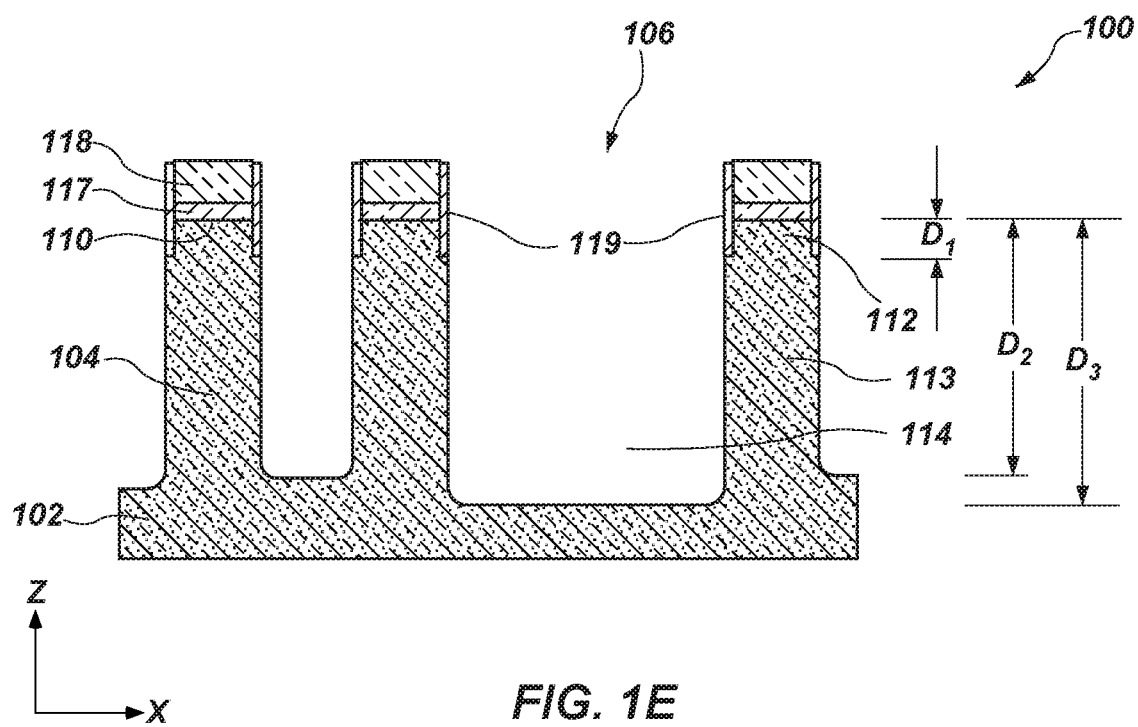

Referring to FIG. 1E, at least portions of the liner 119 may be subsequently removed using one or more conventional material removal processes. For example, horizontal portions of the liner 119 initially formed on the upper surfaces 116 (FIG. 1D) of the base material 102 within the openings 106 may also be removed. Horizontal portions of the liner 119 may also be removed from the upper surfaces of the hard mask material 118, while portions of the liner 119 remain on side surfaces of each of the hard mask material 118, the barrier material 117, and an upper portion of the pillar structures 104. Following removal of the portions of the liner 119, the hard mask material 118 may be used in a second etch process to selectively etch (e.g., selectively dry etch) an additional portion of the underlying base material 102 to extend (e.g., elongate) the depth of the openings 106 and increase the height of the pillar structures 104.

As shown in FIG. 1E, the elongated pillar structures 104 may include upper portions 112 and lower portions 113. In particular, a depth of the upper portions 112 of the pillar structures 104 may correspond to the first depth $D_1$ of the first etch process, described in greater detail above with reference to FIG. 1C, and the lower portions 113 of the pillar structures 104 may correspond to a second depth $D_2$ and/or a third depth $D_3$ following one or more additional material removal processes (e.g., the second etch process). Each of the second depth $D_2$ and the third depth $D_3$ may correspond to a distance between the upper surfaces 110 of the pillar structures 104 and upper surfaces of the base material 102 within the openings 106 (e.g., subsequent to the one or more additional material removal processes). Stated another way, initial portions of the base material 102 may be removed in an initial material removal process (e.g., the first etch process) resulting in the upper portions 112 of the pillar structures 104 extending above the upper surface 116 of the base material 102 within the openings 106. Additional portions of the base material 102 may be removed in one or more subsequent material removal processes (e.g., the second etch process) resulting in the upper portions 112 and the lower portions 113 of the pillar structures 104 extending above the base material 102. In some embodiments, the one or more additional material removal processes includes a single (e.g., one) material removal process resulting in the second depth $D_2$ and the third depth $D_3$, each of which is greater than the first depth $D_1$. In other embodiments, the one or more additional material removal processes includes more than one (e.g., two) material removal processes resulting in each of the second depth $D_2$ and the third depth $D_3$. For example, the second depth $D_2$ may be within selected locations (e.g., narrower openings) between neighboring pillar structures 104, and the third depth $D_3$, which is greater than the second depth $D_2$, may be within alternative locations (e.g., wider openings) between neighboring pillar structures 104, such as within isolation trenches.

Figure 1F:
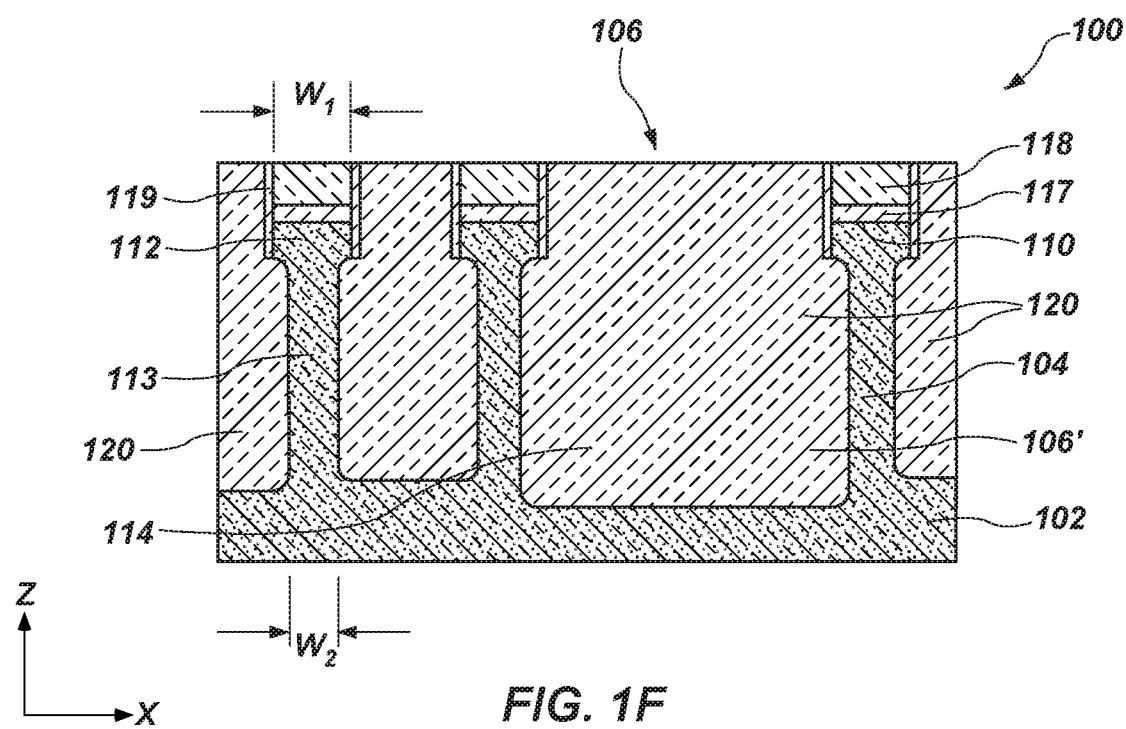

Referring to FIG. 1F, exposed portions of the side surfaces (e.g., sidewalls) of the pillar structures 104 are removed (e.g., partially removed) to form expanded openings 106' laterally adjacent to the lower portions 113 of the pillar structures 104. In some embodiments, the expanded openings 106' are formed by one or more additional material removal processes (e.g., a third etch process) performed subsequent to the second etch process for formation of the lower portions 113 of the pillar structures 104. In other embodiments, the expanded openings 106' may be formed substantially simultaneously with the formation of the lower portions 113 of the pillar structures 104 during the second etch process (e.g., a conventional isotropic etching process) in order to simplify manufacturing processes. The second etch process and/or the third etch process may, for example, be wet etch processes. Appropriate etch chemistries for removing the materials may be determined by a person of ordinary skill in the art. Since the liner 119 remains adjacent to the side surfaces of the upper portions 112 of the pillar structures 104 during the subsequent processing acts, the expanded openings 106' extend into the pillar structures 104 adjacent to the lower portions 113 (e.g., below a lowermost surface of the liner 119) without extending into the pillar structures 104 adjacent to the upper portions 112. By laterally removing material of the pillar structures 104 from the lower portions 113, a lateral dimension (e.g., a width) of individual upper portions 112 of the pillar structures 104 is greater than a lateral dimension (e.g., a width) of respective lower portions 113 thereof, forming a so-called "T-shape" cross-sectional shape. In other words, a critical dimension (e.g., a width $W_1$ extending in the X-direction) of the upper portions 112 of the pillar structures 104 is relatively greater than a critical dimension (e.g., a width $W_2$ extending in the X-direction) of the lower portions 113 thereof, as shown in FIG. 1F. Since the pillar structures 104 exhibit an elongate lateral cross-sectional shape (FIG. 1B), the critical dimension of the upper portions 112 of the pillar structures 104 is relatively greater around an entire perimeter of the pillar structures 104 than a critical dimension of the lower portions 113 thereof, such that a cross-sectional area of the upper portions 112 of the pillar structures 104 is relatively greater than a cross-sectional area of the lower portions 113 thereof. In some embodiments, the pillar structures 104 comprise an abrupt transition between the upper portions 112 and the lower portions 113 thereof. As used herein, the term "abrupt" means and includes a transition that is lacking in continuity or smoothness.

Each of the upper portions 112 and the lower portions 113 of the pillar structures 104 may be formed at a sufficient critical dimension (e.g., width) to provide a larger cross-sectional area on individual pillar structures 104 at the upper portions 112 thereof while providing enhanced isolation between neighboring pillar structures 104 at the lower portions 113 thereof. By way of non-limiting example, the upper portions 112 of the pillar structures 104 may be formed to the width $W_1$ of between about 10 nm and about 60 nm, such as between about 10 nm and about 20 nm, between about 20 nm and about 30 nm, between about 30 nm and about 40 nm, or between about 40 nm and about 60 nm. In some embodiments, the upper portions 112 may be formed to a width $W_1$ of about 20 nm. By way of non-limiting example, the lower portions 113 of the pillar structures 104 may be formed to the width $W_2$ of between about 2 nm and about 40 nm, such as between about 2 nm and about 10 nm, between about 10 nm and about 15 nm, between about 15 nm and about 20 nm, or between about 20 nm and about 40 nm. In some embodiments, the lower portions 113 may be formed to a width $W_2$ of about 10 nm. Relative widths of the upper portions 112 and the lower portions 113 of the pillar structures 104 may be tailored (e.g., selected) to meet design criteria of specific device structures such that the width $W_2$ of the lower portions 113 is reduced by a predetermined amount (e.g., percentage) of an initial width $W_1$ of the upper portions 112 of the pillar structures 104. By way of non-limiting example, a percentage of reduction of the width of the lower portions 113 of the pillar structures 104 may be between about 15 percent and about 75 percent of an initial amount of material, such as between about 15 percent and about 35 percent, between about 35 percent and about 50 percent, or between about 50 percent and about 75 percent relative to the width $W_1$ of the upper portions 112 thereof. A pitch (e.g., a distance between identical points in two adjacent (i.e., neighboring) pillar structures 104) may be between about 10 nm and about 30 nm, such as between about 10 nm and about 20 nm, or between about 20 nm and about 30 nm.

Following formation of the expanded openings 106', an isolation material 120 may be formed within the openings 106 and the expanded openings 106' between neighboring pillar structures 104. In particular, the isolation material 120 may extend horizontally within the expanded openings 106' adjacent to the lower portions 113 of the pillar structures 104. Stated another way, portions of the isolation material 120 (e.g., within the expanded openings 106') may be vertically aligned with portions of the upper portions 112 of the pillar structures 104. As shown in FIG. 1F, the liner 119 may remain on the side surfaces of each of the barrier material 117, the hard mask material 118 and the upper portions 112 of the pillar structures 104 during formation of the isolation material 120. In other embodiments, the liner 119 may be removed prior to formation of the isolation material 120. In some embodiments, the isolation material 120 substantially surrounds the pillar structures 104. The isolation material 120 effectively isolates the pillar structures 104 from one another, and the expanded openings 106' provide an increased distance between the lower portions 113 of neighboring pillar structures 104 relative to conventional structures. Thus, the expanded openings 106' provide enhanced isolation between neighboring pillar structures 104 in order to effectively isolate the pillar structures 104 from one another adjacent to the lower portions 113 thereof, while providing a larger cross-sectional area on individual pillar structures 104 at the upper portions 112 thereof. The larger cross-sectional area of the upper portions 112 of the pillar structures 104 relative to that of the lower portions 113 further facilitates electrical connection with subsequent contact features (e.g., cell contacts) formed on the upper surfaces 110 of the pillar structures 104, as described in greater detail below. In contrast, formation of pillar structures having a substantially vertical profile (e.g., upper and lower portions thereof having a cross-sectional area that is substantially the same) in conventional device structures leads to the requirement of a critical dimension of about 70 percent of a line pitch following an initial etch process to ensure a critical dimension of about 55 percent of the line pitch of a final structure. Thus, the relatively larger cross-sectional area of the upper portions 112 of the pillar structures 104 according to embodiments of the disclosure means that the critical dimension following the initial etch process merely applies to the upper portions 112 thereof, rather than to an entire vertical portion of the pillar structures 104.

The isolation material 120 may be formed of and include at least one dielectric material. By way of non-limiting example, the isolation material 120 may be formed of and include, but is not limited to, an oxide (e.g., silicon oxide (SiO), silicon dioxide (Sift)), a nitride (e.g., silicon nitride (SiN)), aluminum oxide (AlO$_x$), or an oxynitride. In some embodiments, the isolation material 120 may be formulated to be formed in high aspect ratio (HAR) openings, such as the openings 106 and the expanded openings 106', without forming voids. By way of non-limiting example, the openings 106 may be high aspect ratio (HAR) openings, such as having an aspect ratio of at least about 20:1, at least about 40:1, at least about 50:1, at least about 60:1, at least about 80:1, or at least about 100:1. In some embodiments, the openings 106 may have an aspect ratio of between about 20:1 and about 40:1. In addition, the material of the isolation material 120 may be the same material as, or a different material than, the material of the liner 119. The isolation material 120 may be formed through one or more conventional deposition processes (e.g., a PVD process, a CVD process, ALD process, a spin-coating process) to substantially fill the openings 106, including the expanded openings 106'.

One or more removal processes may be conducted to remove portions of the hard mask material 118, the barrier material 117, if present, the liner 119, and the isolation material 120 extending over the openings 106 and over the upper surfaces 110 of the pillar structures 104. In particular, at least portions of the hard mask material 118, the barrier material 117, the liner 119, and the isolation material 120 may be removed by conventional techniques, such that upper surfaces of the isolation material 120 are substantially coplanar with one another and with the upper surfaces 110 of the pillar structures 104. In some embodiments, at least portions of the upper surface 110 of the pillar structures 104 may also be removed. Following the removal processes, upper surfaces of the isolation material 120 may be exposed at a top end of the openings 106. By way of example only, one or more dry etch processes or wet etch processes may be conducted to remove the portions of the hard mask material 118, the barrier material 117, the liner 119, and the isolation material 120. Alternatively, the materials may be subjected to at least one conventional planarization process (e.g., at least one conventional CMP process) to facilitate or enhance the planarity of an upper boundary (e.g., upper surface) of the isolation material 120 and the pillar structures 104 for further processing thereon.

Figure 1G:
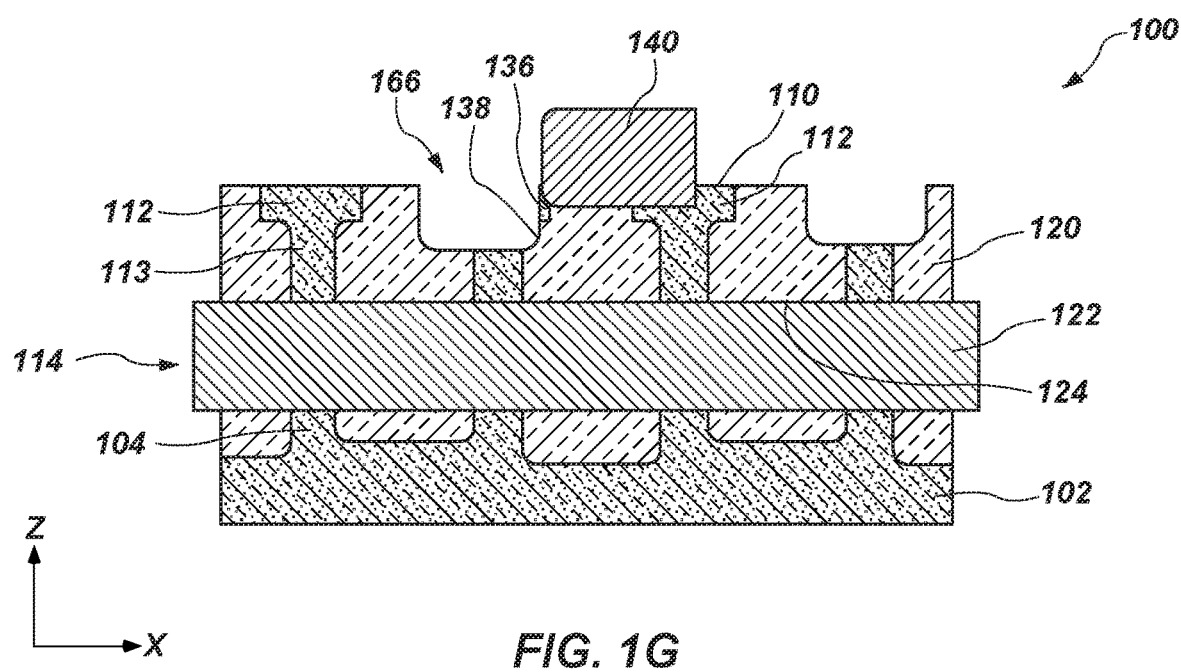

Following the material removal processes, storage node contacts 140 (e.g., 3D cell contacts) may be formed adjacent upper portions of the isolation material 120 and the pillar structures 104, as illustrated in FIG. 1G and as described in greater detail below with reference to FIG. 1H. In some embodiments, portions of the pillar structures 104 and portions of the isolation material 120 may be removed (e.g., etched) to form isolation trenches 114, and access lines 122 (e.g., word lines) may be formed within the isolation trenches 114. The access lines 122 may be located laterally adjacent to the lower portions 113 of the pillar structures 104 and oriented perpendicular to the pillar structures 104. In particular, an upper surface 124 of each of the access lines 122 may be below an upper surface of the lower portions 113 of the pillar structures 104. Stated another way, the upper surfaces 124 of the access lines 122 are recessed below (e.g., vertically below) the bottom surface of the upper portions 112 of the pillar structures 104. In such embodiments, the lower portions 113 of the pillar structures 104 may function as access devices (e.g., transistors). Such access devices may include recessed access devices (RADs), and in some embodiments may include so-called "buried recess access devices" (BRADs).

With continued reference to FIG. 1G, contact openings 166 may be formed in and extend across portions of the pillar structures 104 and the isolation material 120. The size, shape, and spacing of each of the contact openings 166 may at least partially depend upon the size, shape, and spacing of the pillar structures 104, as well as on the size, shape, and spacing of composite structures (e.g., spacers, collars) to be formed within the contact openings 166. In some embodiments, a contact opening 166 may be positioned, sized, and shaped to extend substantially completely laterally across the digit line contact region 104a (FIG. 1B) of one of neighboring pillar structures 104 (e.g., a central pillar structure 104) and partially laterally into one of the storage node contact regions 104b (FIG. 1B) of each of the other two pillar structures 104 (e.g., outer pillar structures 104 flanking the central pillar structure 104). In some embodiments, the contact opening 166 may laterally extend into the storage node contact regions 104b of the outer pillar structures 104 of a group of three neighboring pillar structures 104 to any width facilitating the formation and alignment of additional structures (e.g., a contact plug, a digit line, a nitride cap) on or over the digit line contact region 104a of the central pillar structure 104 using composite structures subsequently formed within the contact opening 166. A center of the contact opening 166 may be aligned with a center of the central pillar structure 104 of the group of three neighboring pillar structures 104. The contact openings 166 may exhibit substantially the same dimensions as one another, and may be regularly spaced apart from one another. For example, each of the contact openings 166 may exhibit a substantially circular lateral cross-sectional shape. In addition, a pitch between adjacent contact openings 166 in a common row may be substantially uniform.

The contact openings 166 may be formed using conventional processes, such as conventional photolithography processes and conventional material removal processes (e.g., etching processes, such as dry etching and/or wet etching), and conventional processing equipment, which are not described in detail herein.

The contact openings 166 may longitudinally extend to any desired depth within one or more of the pillar structures 104 and the isolation material 120, such as a depth within a range of from about 2 nanometers (nm) to about 50 nm, such as between about 2 nm and about 15 nm, between about 15 nm and about 25 nm, between about 25 nm and about 35 nm, or between about 35 nm and about 50 nm. In some embodiments, the contact openings 166 may be formed to a depth of about 30 nm. The access lines 122 may remain unexposed by the contact openings 166. In some embodiments, the access lines 122 may remain covered by nitride caps (not shown). The contact openings 166 may extend beyond the depth $D_1$ (FIG. 1E) of the upper portions 112 of the pillar structures 104 such that the contact openings 166 extend below upper ends of the lower portions 113 of the pillar structures 104, as shown in FIG. 1G.

Since a critical dimension (e.g., the width $W_2$ (FIG. 1F)) of each of the lower portions 113 of the pillar structures 104 is relatively less than a critical dimension (e.g., the width $W_1$ (FIG. 1F)) of the upper portions 112 thereof and less than that associated with the formation of pillar structures for a conventional microelectronic device structure (e.g., a DRAM structure), the contact openings 166 may extend between the lower portions 113 and the upper portions 112 in at least some of neighboring pillar structures 104. For example, the contact openings 166 may substantially reduce (e.g., substantially prevent) physical and/or electrical connection between the lower portions 113 and the upper portions 112 of adjacent pillar structures 104 within specified regions (e.g., within a parameter of neighboring pillar structures 104). In particular, the contact openings 166 may separate a residual portion 136 (e.g., a cosmetic portion) of the upper portion 112 from the lower portions 113 of at least some of the pillar structures 104 by creating a gap 138 between the lower portions 113 and the residual portion 136 of the upper portions 112, as shown in FIG. 1G. The gap 138 (e.g., a disconnect region) may substantially reduce (e.g., substantially prevent) occurrences of bridging (e.g., electrical connection) between two or more adjacent pillar structures 104 in the event that the storage node contacts 140 extend in a horizontal direction between neighboring pillar structures 104. Stated another way, the contact openings 166 may substantially reduce (e.g., substantially sever) electrical connection between neighboring pillar structures 104 when misaligned storage node contacts 140 overlap two or more pillar structures 104. Thus, the storage node contacts 140 may be formed above a respective pillar structure 104 without providing electrical connection between neighboring pillar structures 104 through the storage node contacts 140. In contrast, contact openings within conventional device structures may not sever electrical connection between upper and lower portions of conventional pillars having a constant critical dimension (e.g., width) along an entire height thereof resulting in unintended connection (e.g., bridging) between neighboring pillars, which may short a subsequently formed microelectronic device during use and operation. The methods of the disclosure substantially reduce the occurrence of such unintended connections between neighboring pillar structures 104 as a result of formation of the pillar structures 104 having the upper portions 112 that are relatively greater in width than the width of the lower portions 113 thereof. Thus, the relatively smaller critical dimension of each of the lower portions 113 may reduce various processing complexities (e.g., complexities associated with properly sizing and aligning various contact openings and structures) associated with the formation of conventionally pillars for a microelectronic device structure.

While one storage node contact 140 is shown, for illustrative purposes, as a discrete structure overlying the isolation material 120 and the pillar structures 104 of the device structure 100 in FIG. 1G, one of ordinary skill in the art will understand that formation of the storage node contacts 140 may be conducted at the time of adjacent structures (e.g., contacts, lines, etc.), as described in greater detail below.

Figure 1H:
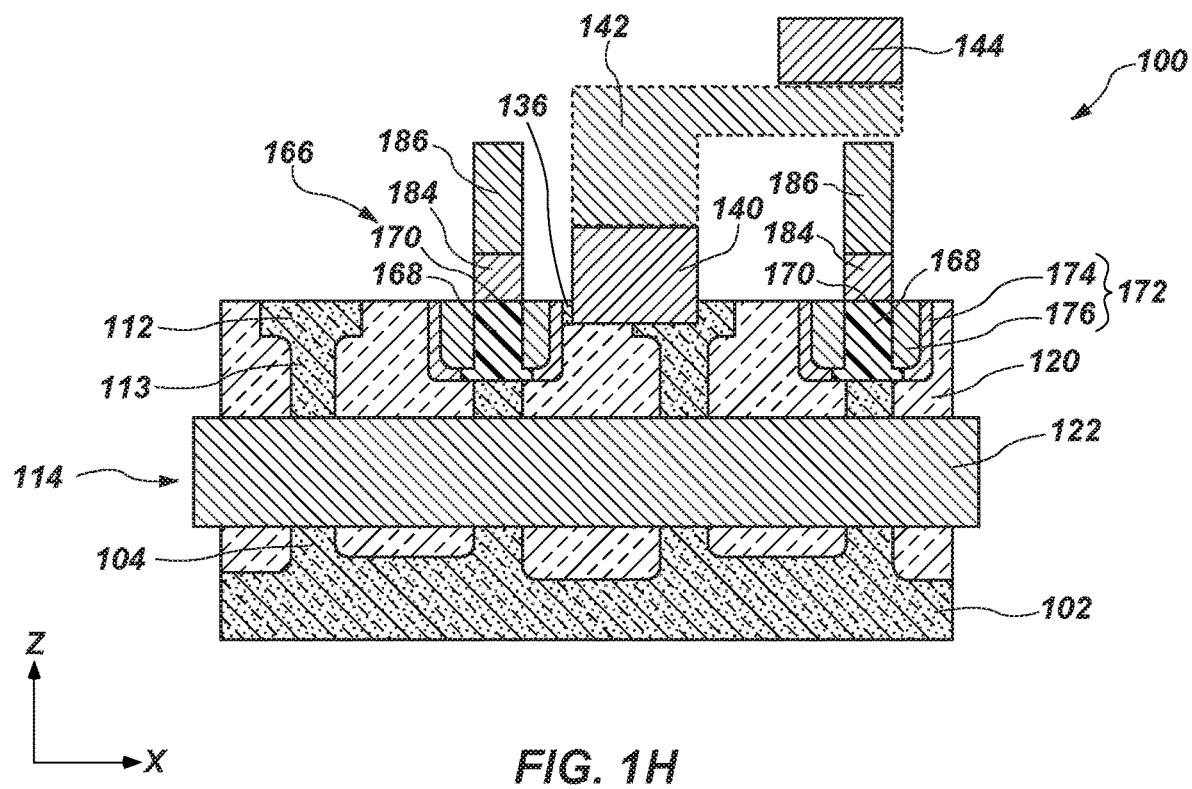

Referring next to FIG. 1H, following the formation of the pillar structures 104 and the contact openings 166, the device structure 100 may be subjected to additional processing. By way of non-limiting example, referring collectively to FIGS. 1I and 1H, the storage node contact regions 104b and the digit line contact region 104a of each of the pillar structures 104 may be separated from one another by the isolation trenches 114 having the access lines 122 therein. In addition, the storage node contacts 140 may be formed in the storage node contact regions 104b of the pillar structures 104, digit line contacts 168 may be formed in the digit line contact regions 104a of the pillar structures 104, and digit lines 184 may be formed on or over upper surfaces 170 of the digit line contacts 168. In particular, the digit lines 184 may be formed adjacent to or above the upper surfaces 110 of the pillar structures 104. In some embodiments, upper surfaces of the storage node contacts 140 may extend vertically above upper surfaces of the digit line contacts 168, as depicted in FIG. 1H. In other embodiments, the upper surfaces of the storage node contacts 140 and the upper surfaces of the digit line contacts 168 may be substantially coplanar with one another.

Figure 1I:
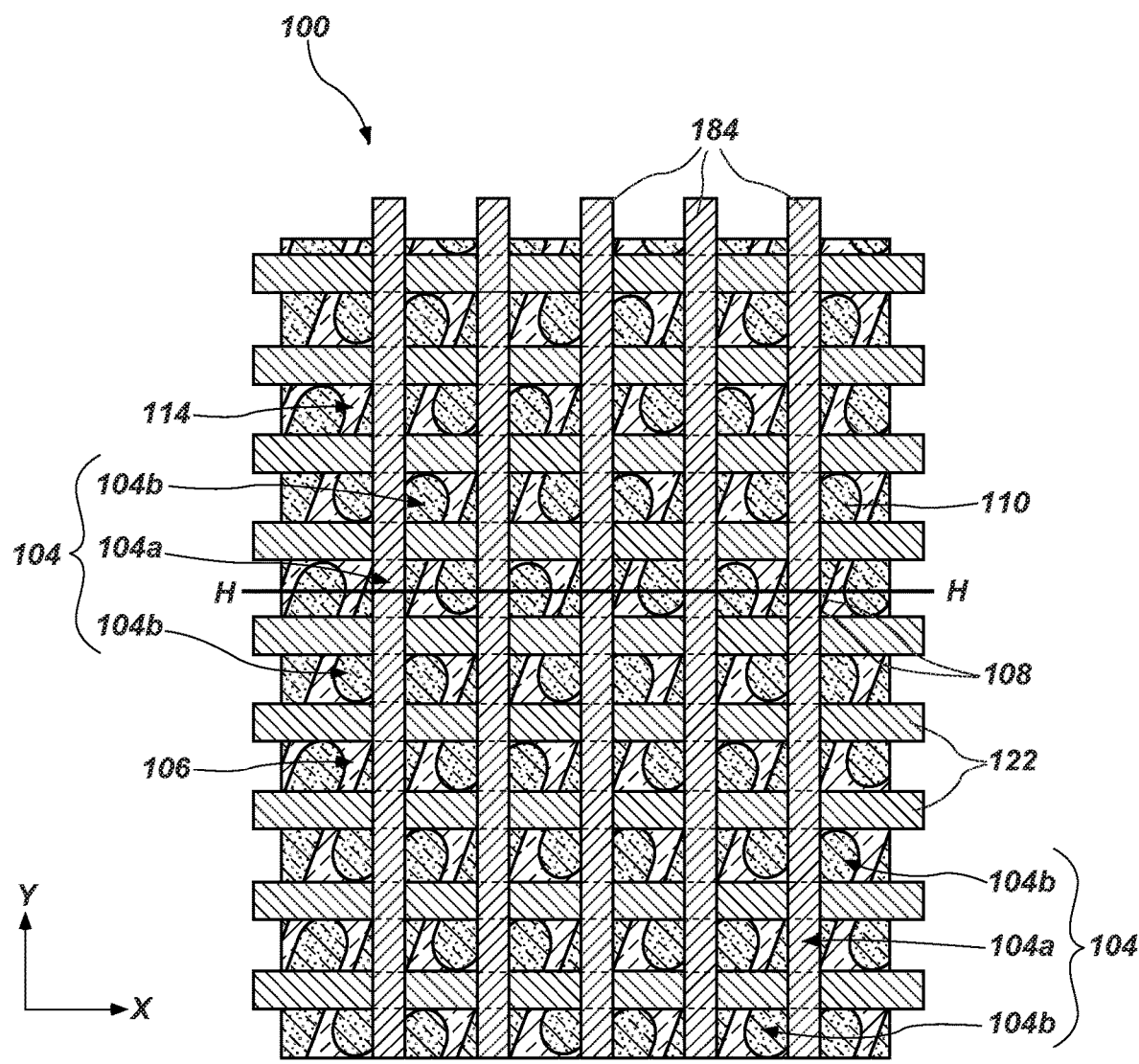

The process of forming the storage node contacts 140 may remove upper portions of adjacent structures to form the storage node contacts 140 within openings, with a depth of the openings (e.g., a lowermost surface of the storage node contacts 140) being relatively less than the depth $D_1$ (FIG. 1E) of the upper portions 112 of the pillar structures 104. Thus, the storage node contacts 140 remain isolated (e.g., electrically isolated) from the lower portions 113 of the pillar structures 104. The depth of the openings of the storage node contacts 140 may also be relatively less than the depth of the contact openings 166. In other words, the storage node contacts 140 are located within openings that are relatively shallower than the contact openings 166 of the digit line contacts 168 with the residual portion 136 being physically and electrically isolated from the digit line contacts 168. In other words, a lowermost surface of each of the storage node contacts 140 is located in a plane that is vertically above a plane of a lowermost surface of each of the digit line contacts 168. As depicted in FIG. 1H, the process of forming the digit line contacts 168 may include removing upper portions of adjacent structures to form composite structures 172 (e.g., planarized structures) including oxide structures 174 and nitride structures 176. The access lines 122 may extend in a first lateral direction (e.g., the X-direction) and the digit lines 184 may extend in a second, different lateral direction (e.g., the Y-direction). Furthermore, as shown in FIG. 1H, cap structures 186 (e.g., nitride dielectric cap structures) may be formed on or over the digit lines 184. FIG. 1I is a top-down view of the device structure 100 at the processing stage shown in FIG. 1H, wherein a line H-H corresponds to the cross-section of the device structure 100 depicted in FIG. 1H. For clarity, the cap structures 186 are absent from (i.e., not depicted in) FIG. 1I.

The access lines 122, the storage node contacts 140, the digit line contacts 168, and the digit lines 184 may each individually be formed of and include at least one electrically conductive material including, but not limited to, one or more of a metal (e.g., tungsten, titanium, nickel, platinum, gold), a metal alloy, a metal-containing material (e.g., metal nitrides, metal silicides, metal carbides, metal oxides), and a conductively-doped semiconductor material (e.g., conductively-doped silicon, conductively-doped germanium, conductively-doped silicon germanium). By way of non-limiting example, the access lines 122, storage node contacts 140, the digit line contacts 168, and the digit lines 184 may each individually comprise one or more of titanium nitride (TiN), tantalum nitride (TaN), tungsten nitride (WN), titanium aluminum nitride (TiAlN), elemental titanium (Ti), elemental platinum (Pt), elemental rhodium (Rh), elemental iridium (Ir), iridium oxide ($IrO_x$), elemental ruthenium (Ru), ruthenium oxide ($RuO_x$), and alloys thereof.

The access lines 122, the storage node contacts 140, the digit line contacts 168, and the digit lines 184 may each individually be formed using conventional processes (e.g., conventional deposition processes, such as one or more of in situ growth, spin-on coating, blanket coating, CVD, ALD, and PVD; conventional patterning and material removal processes, such as conventional alignment processes, conventional photolithographic exposure processes, conventional development processes, conventional etching processes) and conventional processing equipment, which are not described in detail herein.

With continued reference to FIG. 1H, redistribution material (RDM) structures 142 (also referred to as "redistribution layer (RDL) structures") may, optionally, be formed on or over the storage node contacts 140, and storage node structures 144 (e.g., capacitor structures) may be formed over and operably coupled to the RDM structures 142. The RDM structures 142, if present, may be configured to effectively shift (e.g., stagger, adjust, modify) lateral positions (e.g., in the X-direction) of the storage node contacts 140 to accommodate a desired arrangement (e.g., a hexagonal close packed arrangement) of the storage node structures 144 over and in electrical communication with the storage node contacts 140. The RDM structures 142 may each individually be formed of and include an electrically conductive material including, but not limited to, one or more of a metal (e.g., tungsten, titanium, nickel, platinum, gold), a metal alloy, a metal-containing material (e.g., metal nitrides, metal silicides, metal carbides, metal oxides), and a conductively-doped semiconductor material (e.g., conductively-doped silicon, conductively-doped germanium, conductively-doped silicon germanium). By way of non-limiting example, the RDM structures 142 may individually comprise one or more of TiN, TaN, WN, TiAlN, Ti, Pt, Rh, Ir, $IrO_x$, Ru, $RuO_x$, and alloys thereof.

The storage node structures 144 may be configured to store a charge representative of a programmable logic state. For example, a charged state of the storage node structures 144 may represent a first logic state (e.g., a logic 1), and an uncharged state of the storage node structures 144 may represent a second logic state (e.g., a logic 0). In some embodiments, the storage node structures 144 comprise a dielectric material configured to storage a charge associated with a logic state. The dielectric material may, for example, comprise one or more of include silicon dioxide, silicon nitride, polyimide, titanium dioxide ($TiO_2$), tantalum oxide ($Ta_2O_5$), aluminum oxide ($Al_2O_3$), an oxide-nitride-oxide material (e.g., silicon dioxide-silicon nitride-silicon dioxide), strontium titanate ($SrTiO_3$)(STO), barium titanate ($BaTiO_3$), hafnium oxide ($HfO_2$), zirconium oxide ($ZrO_2$), a ferroelectric material (e.g., ferroelectric hafnium oxide, ferroelectric zirconium oxide, lead zirconate titanate (PZT), etc.), and a high-k dielectric material. In some embodiments, the storage node structures 144 comprise zirconium oxide.

The RDM structures 142 and the storage node structures 144 may each individually be formed using conventional processes (e.g., conventional deposition processes, such as one or more of in situ growth, spin-on coating, blanket coating, CVD, ALD, and PVD; conventional patterning and material removal processes, such as conventional alignment processes, conventional photolithographic exposure processes, conventional development processes, conventional etching processes) and conventional processing equipment, which are not described in detail herein.

Accordingly, an apparatus comprising a structure is disclosed. The structure comprises a base material, an access device recessed within the base material, and a contact pad adjacent to the access device. The access device comprises an elongated pillar extending from the base material. The elongated pillar has an upper portion that is greater in width than a lower portion thereof. The structure also comprises a digit line contact adjacent to the elongated pillar. The apparatus also comprises digit lines extending in a first lateral direction with one of the digit lines being located over the digit line contact.

Apparatuses (e.g., electronic devices) including the device structure 100 including the particular configuration of the pillar structures 104 having the upper portions 112 that are relatively greater in width than the lower portions 113 thereof formed in accordance with embodiments of the disclosure may be formed by conducting additional process acts, which are not described in detail herein. The differing widths of the pillar structures 104 at the upper portions 112 and the lower portions 113 provide a tailored thickness of the pillar structures 104 such that the occurrence of unintended connection is reduced between neighboring pillar structures 104 without significantly affecting resistance. In addition, the larger cross-sectional area of the upper portions 112 of the pillar structures 104 provides a larger contact area and, thus, provides a larger margin for alignment between contacts (e.g., the pillar structures 104 and the storage node contacts 140). Therefore, misalignment tolerance is much larger than that of conventional device structures. The relatively smaller critical dimension of each of the lower portions 113 of the pillar structures 104 also provides an increased distance (e.g., registration window) between neighboring pillar structures 104 laterally adjacent to the lower portions 113 thereof. The increased distance between mid and lower portions of neighboring pillar structures 104 facilitates reduced processing complexities for optimal formation of active regions of the access lines 122. In particular, development of robust etch processes within the increased distance within the openings 106 and the expanded openings 106' (FIG. 1F) between neighboring pillar structures 104 results in enhanced formation of so-called "fin structures." Scalability may be enhanced in future generation device structures using the pillar structures 104 having differing (e.g., reduced) widths and differing (e.g., reduced) distances therebetween.

Accordingly, a method of forming an apparatus is also disclosed. The method comprises forming pillar structures extending from a base material. Upper portions of the pillar structures may exhibit a lateral width that is relatively greater than a lateral width of lower portions of the pillar structures. The method also comprises forming access lines laterally adjacent to the lower portions of the pillar structures and forming digit lines above upper surfaces of the pillar structures.

One of ordinary skill in the art will appreciate that, in accordance with additional embodiments of the disclosure, the methods described above in relation to FIGS. 1C through 1F may be adapted to design needs of different device structures (e.g., different microelectronic device structures). By way of non-limiting example, in accordance with additional embodiments of the disclosure, FIGS. 2A through 2E show simplified, partial cross-sectional views of device structures 100' formed by alternative methods than the previous device structure 100. Throughout the remaining description and the accompanying figures, functionally similar features (e.g., structures, devices) are referred to with similar reference numerals. To avoid repetition, not all features shown in the remaining figures (including FIGS. 2A through 2E) are described in detail herein. Rather, unless described otherwise below, a feature designated by a reference numeral of a previously-described feature (whether the previously described feature is first described before the present paragraph, or is first described after the present paragraph) will be understood to be substantially similar to the previously described feature.

Figure 2A:
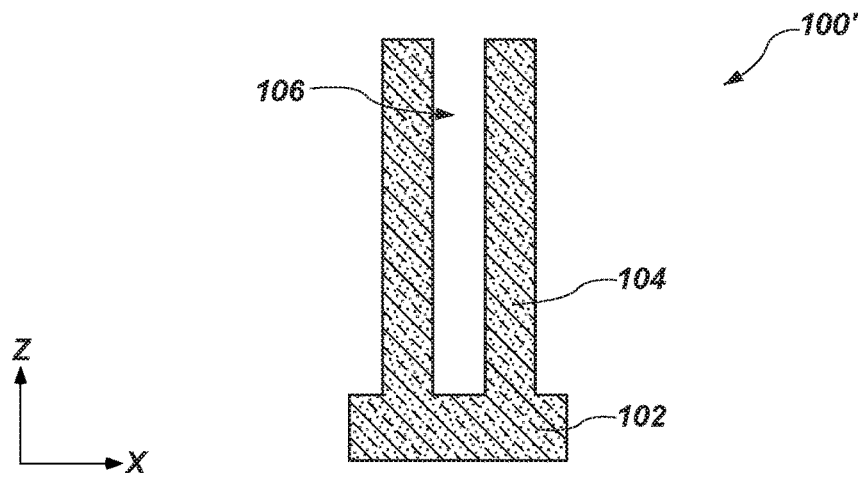
FIGS. 2A through 2E are simplified partial cross-sectional views illustrating a method of forming another apparatus including a device structure, in accordance with additional embodiments of the disclosure.

Formation of a device structure 100' including the base material 102 (e.g., a semiconductive material), the pillar structures 104 longitudinally extending from and integral with the base material 102, and the openings 106 extending vertically (e.g., in the Z-direction) between the pillar structures 104 is shown in FIG. 2A. Each of the pillar structures 104 may exhibit an elongate lateral cross-sectional shape (see FIG. 1B), such as an oblong lateral cross-sectional shape, similar to the device structure 100 described above and depicted in FIGS. 1A and 1B. Further, the pillar structures 104 including the two storage node contact regions 104b (FIG. 1B) and the digit line contact region 104a (FIG. 1B) laterally between the two storage node contact regions 104b may be formed using the patterned hard mask material 118 (FIG. 1C) to selectively etch (e.g., selectively dry etch) the underlying base material 102 in an etch process, similar to the device structure 100 described above and depicted in FIG. 1C. Rather than etching the base material 102 to a first depth in a first etch process and subsequently etching the base material 102 to a second and/or third depth, the pillar structures 104 of the device structure 100' depicted in FIG. 2A may be formed using a single (e.g., one) conventional etching process (e.g., a conventional anisotropic etching process) to form the pillar structures 104 to a predetermined depth. Stated another way, the openings 106 may be formed in a single (e.g., one) process act. By way of non-limiting example, the pillar structures 104 may be formed to a depth of between about 100 nm and about 300 nm. In some embodiments, the pillar structures 104 may be formed to a depth of about 250 nm.

Figure 2B:
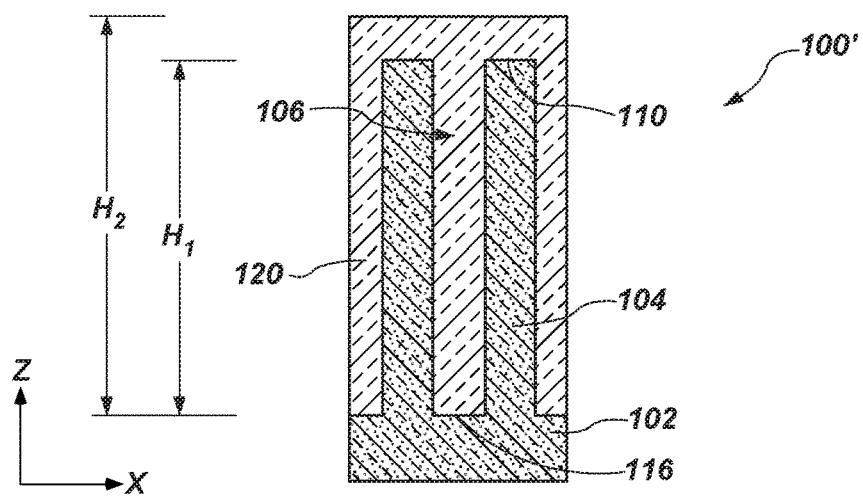

Referring to FIG. 2B, following formation of the pillar structures 104 and the openings 106, the isolation material 120 may be formed over the pillar structures 104 and within the openings 106 formed in the base material 102 to substantially fill the openings 106 therein. The isolation material 120 may substantially cover the side surfaces (e.g., sidewalls) of the pillar structures 104. In some embodiments, the isolation material 120 may be formulated to extend along an entire vertical portion of the pillar structures 104 (e.g., from the upper surfaces 110 of the pillar structures 104 to the upper surface 116 of the base material 102). An upper surface of the isolation material 120 may extend above the upper surfaces 110 of the pillar structures 104 such that a height $H_2$ of the isolation material 120 is greater than a height $H_1$ of the pillar structures 104, as shown in FIG. 2B. For example, the isolation material 120 may initially be deposited to extend vertically (e.g., in the Z-direction) above the upper surfaces 110 of the pillar structures 104 by a predetermined amount. By way of non-limiting example, the isolation material 120 may be formed to a depth (e.g., thickness) of between about 100 nm and about 300 nm.

As in the previous embodiment, the isolation material 120 may be formed of and include at least one dielectric material By way of non-limiting example, the isolation material 120 may be formed of and include, but is not limited to, an oxide (e.g., silicon oxide (SiO), silicon dioxide ($SiO_2$)), a nitride (e.g., silicon nitride (SiN)), aluminum oxide ($AlO_x$), or an oxynitride. In some embodiments, the isolation material 120 may be formulated to be formed in the openings 106, without forming voids. The isolation material 120 may be formed through one or more conventional deposition processes (e.g., a PVD process, a CVD process, ALD process, a spin-coating process) to substantially fill the openings 106.

Figure 2C:
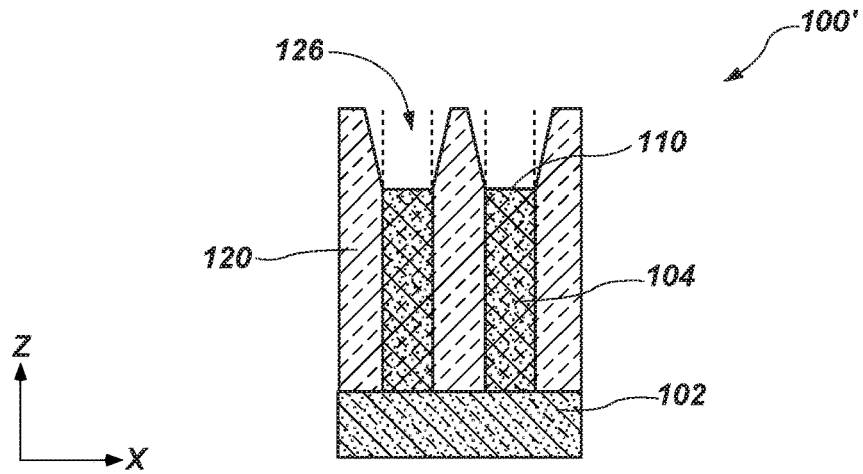

Referring to FIG. 2C, following formation of the isolation material 120, portions of the isolation material 120 and/or the pillar structures 104 may be removed using one or more material removal processes (e.g., selective material removal processes) to form openings 126 above the upper surfaces 110 of the pillar structures 104. The openings 126 may extend across, or beyond, a full lateral extent of the upper surfaces 110 of each of the pillar structures 104. In other words, an entire portion of the upper surfaces 110 of the pillar structures 104 may be exposed following formation of the openings 126 in the isolation material 120. In some embodiments, inner sidewalls of the isolation material 120 defining the openings 126 may exhibit a tapered profile with an upper portion of individual openings 126 having a greater critical dimension (e.g., width) than a lower portion thereof, as shown in FIG. 2C. In other embodiments, the openings 126 may have a different profile, for example, a substantially orthogonal (e.g., substantially rectangular) profile, a dish-shaped profile, or any other three-dimensional recess shape, such that at least portions (e.g., upper ends) of the openings 126 extend beyond sidewalls of the pillar structures 104 in at least one lateral direction (e.g., the X-direction).

The openings 126 may be formed using conventional processes, such as conventional photolithography processes and conventional material removal processes (e.g., etching processes, such as dry etching and/or wet etching), and conventional processing equipment, which are not described in detail herein.

In some embodiments, the height $H_1$ (FIG. 2B) of individual pillar structures 104 may remain unchanged following initial formation thereof. In other embodiments, upper portions of the pillar structures 104 (e.g., adjacent to the upper surfaces 110 thereof) may be removed (e.g., recessed) following formation of the openings 126 in the isolation material 120. In such embodiments, the pillar structures 104 may be recessed using conventional processes, such as conventional photolithography processes and conventional material removal processes (e.g., etching processes, such as dry etching and/or wet etching), and conventional processing equipment, which are not described in detail herein.

Figure 2D:
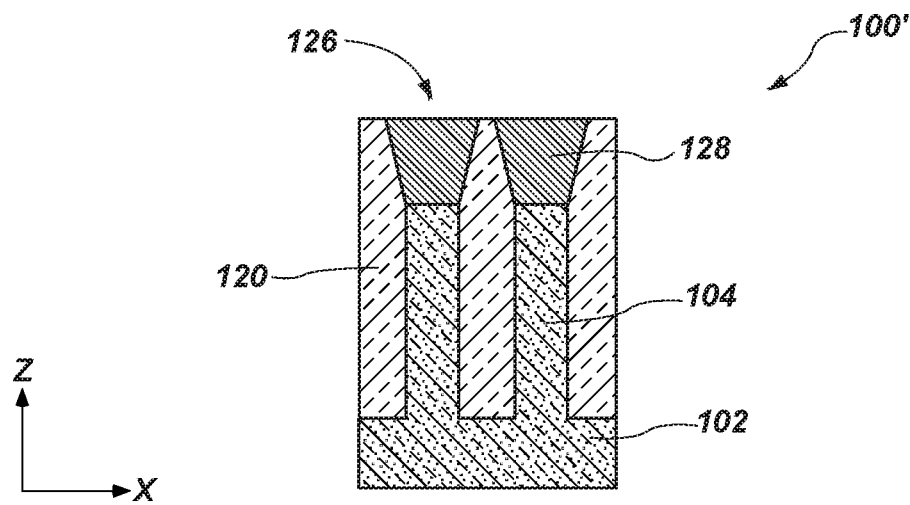

Referring to FIG. 2D, a precursor material 128 may be grown in situ within the openings 126. For example, the precursor material 128 may be formed by selective CVD deposition process in an epitaxial "bottom-up" growth of a semiconductive material (e.g., silicon) within the openings 126 using the material of the pillar structures 104, for example, as a reactant upon at least a portion of such semiconductive materials being exposed. In particular, such material may be electrically conductive to supply electrons needed for decomposition of a precursor gas and the resulting deposition of the material. The precursor material 128 may at least partially fill (e.g., substantially fill) the openings 126 upon formation. In some embodiments, additional materials (e.g., seed materials, barrier materials) may also be present within the openings 126.

The precursor material 128 may include, for example, an amorphous enhancer material (e.g., a starting film). By way of non-limiting example, the precursor material 128 may be formed of and include amorphous silicon, amorphous germanium, or amorphous silicon germanium. The precursor material 128 may be doped with one or more dopants selected from phosphorus, boron, arsenic, and indium. The precursor material 128 may be selectively etchable relative to the material of the pillar structures 104.

With continued reference to FIG. 2D, filling the openings 126 with the precursor material 128 may include forming overburden regions of the precursor material 128, which may be removed during subsequent processing acts. For example, the precursor material 128 may be exposed to a chemical mechanical planarization (CMP) process to substantially planarize the precursor material 128 such that exposed surfaces thereof are substantially coplanar with an upper surface of the isolation material 120. Exposing the precursor material 128 to the CMP process may remove the overburden regions of the precursor material 128 external to the openings 106 in order to electrically isolate the pillar structures 104.

Figure 2E:
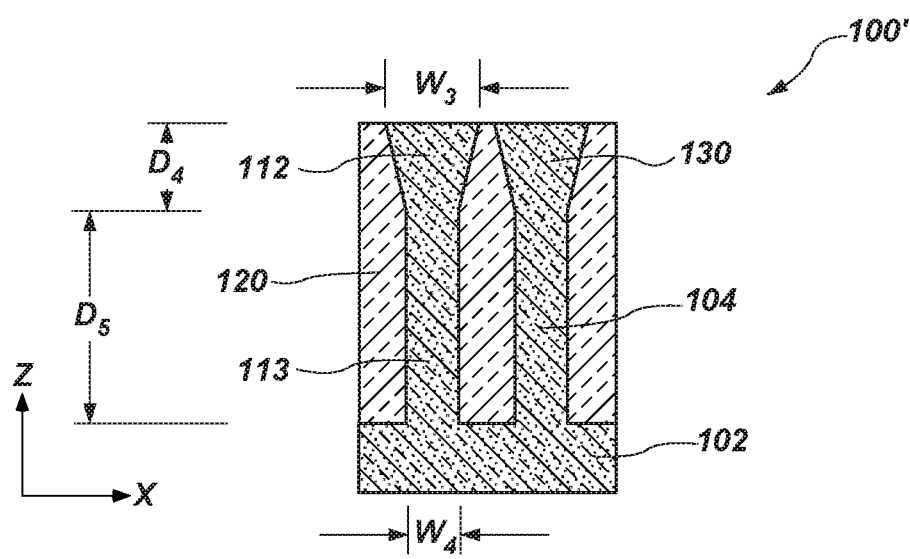

Referring to FIG. 2E, the precursor material 128 (FIG. 2D) may subsequently be processed using one or more treatment (e.g., heat treatment) acts to form a pillar material 130. For example, in embodiments where the precursor material 128 is formed of an amorphous material, the precursor material 128 may be subjected to one or more heat treatment acts to increase a temperature of the material above an amorphous-crystalline transition point in order to form the pillar material 130. The pillar material 130 may, alternatively, or additionally, be formed using chemical vapor deposition (CVD) or selective CVD deposition of a semiconductive material, for example, using conventional techniques.

In some embodiments, the pillar structures 104 and the pillar material 130 may each be formed of and include a semiconductive material including, but not limited to, at least one of a silicon material, a silicon-germanium material, a germanium material, a gallium arsenide material, a gallium nitride material, and an indium phosphide material. In other embodiments, the material composition and/or structure of the pillar material 130 may differ from a material composition and/or structure of the pillar structures 104. For example, the pillar material 130 may exhibit a material structure (e.g., a crystalline structure) that differs from a material structure of the pillar structures 104. One of ordinary skill in the art will understand that formation of such materials, including types of materials, processing conditions (e.g., temperature) and the like, may be selected to achieve the desired performance requirements while minimizing undesirable levels of resistivity, which variables may be optimized to achieve improved structural properties.

Once processed, the pillar material 130 forms the upper portions 112 of the pillar structures 104 and the initial portion of the pillar structures 104 forms the lower portions 113 thereof. A depth $D_4$ of the upper portions 112 of the pillar structures 104 corresponds to a depth of the openings 126 (FIG. 2C) and a depth $D_5$ of the lower portions 113 thereof corresponds to a depth of the initial and/or remaining portions of the pillar structures 104. In some embodiments, the depth $D_4$ of the upper portions 112 of the pillar structures 104 is relatively greater than the depth $D_5$ of the lower portions 113 thereof. In other embodiments, the depth $D_4$ of the upper portions 112 of the pillar structures 104 is relatively less than the depth $D_5$ of the lower portions 113 thereof, as depicted in FIG. 2E.

In some embodiments, a profile of the upper portions 112 and the lower portions 113 of the pillar structures 104 may exhibit abrupt topographical changes as a result of the openings 126 having a substantially orthogonal (e.g., substantially rectangular) profile. In other embodiments, the profile of the upper portions 112 and the lower portions 113 of the pillar structures 104 may exhibit smooth topographical changes as a result of the openings 126 having a tapered or a dish-shaped profile, for example. Stated another way, a profile of the upper portions 112 and the lower portions 113 of the pillar structures 104 may exhibit a "T-shaped" profile, as viewed from the partial cross-sectional view of FIG. 1F or a "Y-shaped" profile, for example, as viewed from the partial cross-sectional view of FIG. 2E. As in the previous embodiment of the device structure 100 depicted in FIG. 1F, a lateral dimension (e.g., a width) of individual upper portions 112 of the pillar structures 104 of the device structure 100' of the present embodiment is greater than a lateral dimension of respective lower portions 113 thereof. In other words, a critical dimension (e.g., a width $W_3$ extending in the X-direction) of the upper portions 112 of the pillar structures 104 is relatively greater than a critical dimension (e.g., a width $W_4$ extending in the X-direction) of the lower portions 113 thereof, as shown in FIG. 2E. Since the pillar structures 104 exhibit an elongate lateral cross-sectional shape (FIG. 1B), the critical dimension of the upper portions 112 of the pillar structures 104 is relatively greater around an entire perimeter of the pillar structures 104 than a critical dimension of the lower portions 113 thereof, such that a cross-sectional area of the upper portions 112 of the pillar structures 104 is relatively greater than a cross-sectional area of the lower portions 113 thereof.

Aspects (e.g., processing stages and structures) of the methods described above with reference to FIGS. 2A through 2E may be employed in additional methods of forming an apparatus to facilitate one or more benefits (e.g., at least some of the benefits effectuated by the methods previously described with reference to FIGS. 1A through 1I, and/or additional benefits) as compared to conventional methods and conventional apparatuses. The methods of the disclosure may reduce or eliminate process acts utilized to form many conventional apparatuses that may be used for similar operations as the device structure 100'. For example, the pillar structures 104 may be tailored (e.g., selected) to meet design criteria of specific apparatuses such that the relative widths of the upper portions 112 and the lower portions 113 thereof may be used to reduce the occurrence of unintended connection between neighboring pillar structures 104 and to provide a larger cross-sectional area of the upper portions 112 thereof to provide a larger contact area and a larger margin for alignment between contacts in order to properly position subsequently formed structures within the apparatus at desired locations to enhance proper alignment between adjacent structures (e.g., electrical connections).

Figure 3:
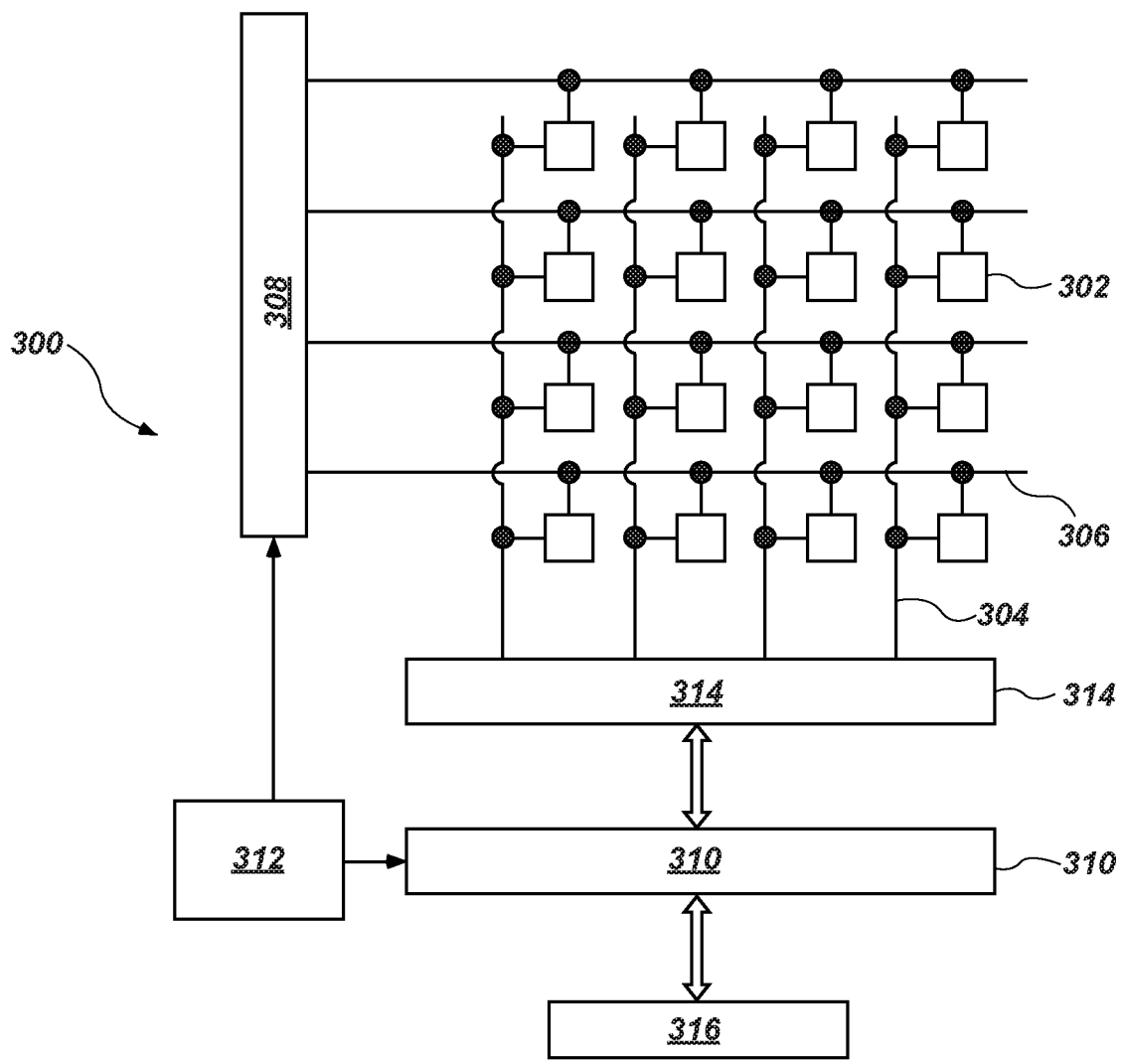
FIG. 3 is a functional block diagram of a memory device, in accordance with an embodiment of the disclosure.

FIG. 3 illustrates a functional block diagram of a memory device 300, in accordance with an embodiment of the disclosure. The memory device 300 may include, for example, an embodiment of the device structures 100, 100' previously described herein. As shown in FIG. 3, the memory device 300 may include memory cells 302, digit lines 304 (e.g., corresponding to the digit lines 184 of the device structures 100, 100' shown in FIGS. 1A through 2E), access lines 306 (e.g., corresponding to the access lines 122 of the device structures 100, 100' shown in FIGS. 1A through 2E), a row decoder 308, a column decoder 310, a memory controller 312, a sense device 314, and an input/output device 316.

The memory cells 302 of the memory device 300 are programmable to at least two different logic states (e.g., logic 0 and logic 1). Each memory cell 302 may individually include a capacitor and transistor (e.g., a pass transistor). The capacitor stores a charge representative of the programmable logic state (e.g., a charged capacitor may represent a first logic state, such as a logic 1; and an uncharged capacitor may represent a second logic state, such as a logic 0) of the memory cell 302. The transistor grants access to the capacitor upon application (e.g., by way of one of the access lines 306) of a minimum threshold voltage to a semiconductive channel thereof for operations (e.g., reading, writing, rewriting) on the capacitor.

The digit lines 304 are connected to the capacitors (e.g., corresponding to the storage node structures 144 of the device structures 100, 100' shown in FIGS. 1A through 2E) of the memory cells 302 by way of the transistors of the memory cells 302. The access lines 306 extend perpendicular to the digit lines 304, and are connected to gates of the transistors of the memory cells 302. Operations may be performed on the memory cells 302 by activating appropriate digit lines 304 and access lines 306. Activating a digit line 304 or an access line 306 may include applying a voltage potential to the digit line 304 or the access line 306. Each column of memory cells 302 may individually be connected to one of the digit lines 304, and each row of the memory cells 302 may individually be connected to one of the access lines 306. Individual memory cells 302 may be addressed and accessed through the intersections (e.g., cross points) of the digit lines 304 and the access lines 306.

The memory controller 312 may control the operations of memory cells 302 through various components, including the row decoder 308, the column decoder 310, and the sense device 314. The memory controller 312 may generate row address signals that are directed to the row decoder 308 to activate (e.g., apply a voltage potential to) predetermined access lines 306, and may generate column address signals that are directed to the column decoder 310 to activate (e.g., apply a voltage potential to) predetermined digit lines 304. The memory controller 312 may also generate and control various voltage potentials employed during the operation of the memory device 300. In general, the amplitude, shape, and/or duration of an applied voltage may be adjusted (e.g., varied), and may be different for various operations of the memory device 300.

During use and operation of the memory device 300, after being accessed, a memory cell 302 may be read (e.g., sensed) by the sense device 314. The sense device 314 may compare a signal (e.g., a voltage) of an appropriate digit line 304 to a reference signal in order to determine the logic state of the memory cell 302. If, for example, the digit line 304 has a higher voltage than the reference voltage, the sense device 314 may determine that the stored logic state of the memory cell 302 is a logic 1, and vice versa. The sense device 314 may include transistors and amplifiers to detect and amplify a difference in the signals (commonly referred to in the art as "latching"). The detected logic state of a memory cell 302 may be output through the column decoder 310 to the input/output device 316. In addition, a memory cell 302 may be set (e.g., written) by similarly activating an appropriate access line 306 and an appropriate digit line 304 of the memory device 300. By controlling the digit line 304 while the access line 306 is activated, the memory cell 302 may be set (e.g., a logic value may be stored in the memory cell 302). The column decoder 310 may accept data from the input/output device 316 to be written to the memory cells 302. Furthermore, a memory cell 302 may also be refreshed (e.g., recharged) by reading the memory cell 302. The read operation will place the contents of the memory cell 302 on the appropriate digit line 304, which is then pulled up to full level (e.g., full charge or discharge) by the sense device 314. When the access line 306 associated with the memory cell 302 is deactivated, all of memory cells 302 in the row associated with the access line 306 are restored to full charge or discharge.

Thus, a memory device according to embodiments of the disclosure comprises a memory controller, a row decoder, a column decoder, word lines, digit lines, memory cells, and elongate semiconductive pillars. The row decoder is operably coupled to the memory controller. The column decoder operably coupled to the memory controller. The word lines are operably coupled to the row decoder. The digit lines are operably coupled to the column decoder. The memory cells are proximate intersections of the word lines and the digit lines, and comprise storage node structures and access devices electrically connected to the storage node structures. The elongate semiconductive pillars are operably coupled to the storage node structures of the memory cells and the digit lines. The elongate semiconductive pillars each comprise storage node contact regions, and a digit line contact region laterally between the memory cell contact regions. The upper portions of the elongate semiconductive pillars comprise a cross-sectional area that is relatively greater than a cross-sectional area of a lower portion thereof.

Figure 4:
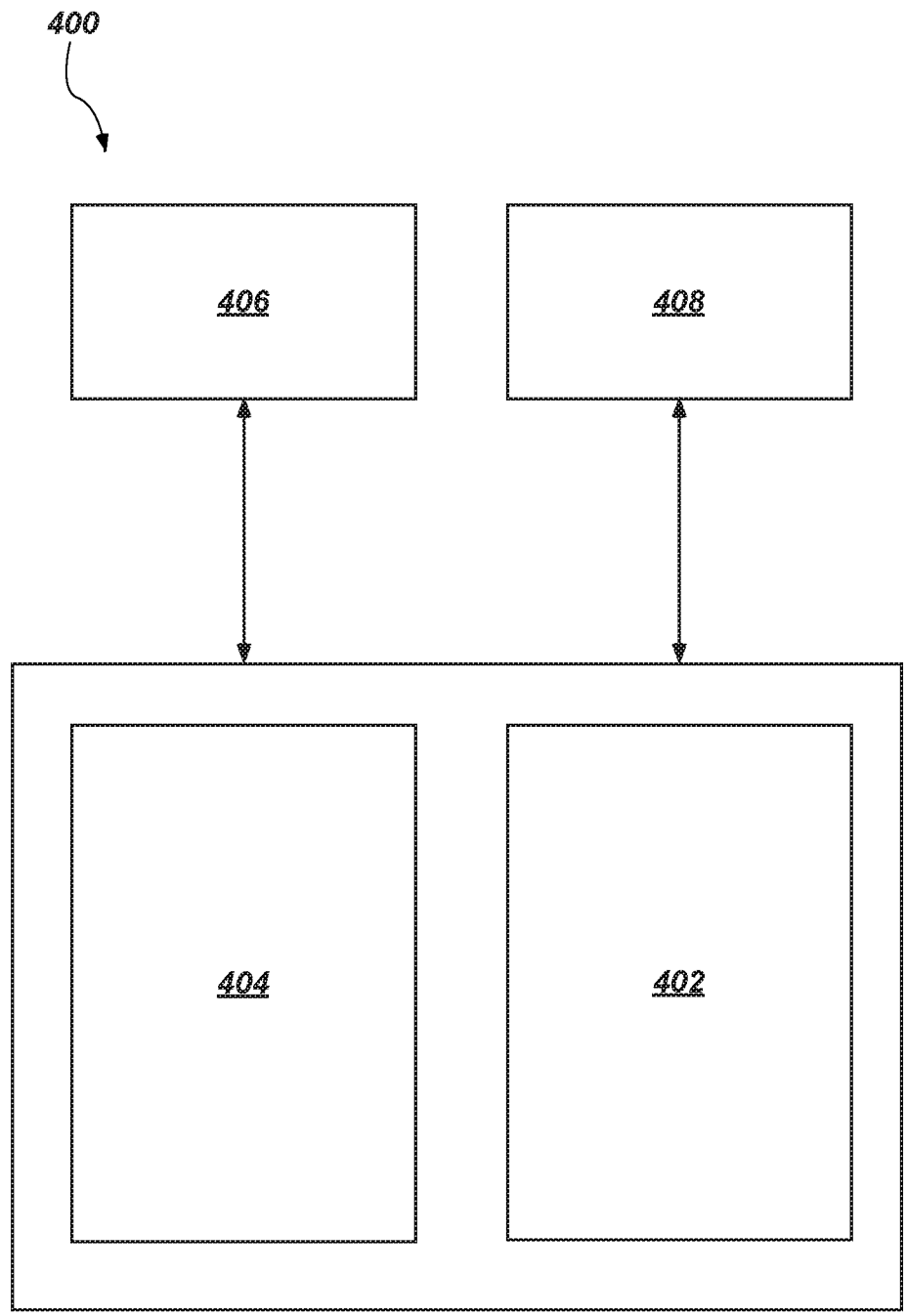
FIG. 4 is a schematic block diagram of an electronic system, in accordance with an embodiment of the disclosure.

Microelectronic device structures (e.g., the device structures 100, 100') and microelectronic devices (e.g., the memory device 300) in accordance with embodiments of the disclosure may be used in embodiments of electronic systems of the disclosure. For example, FIG. 4 is a block diagram of an illustrative electronic system 400 according to embodiments of the disclosure. The electronic system 400 may comprise, for example, a computer or computer hardware component, a server or other networking hardware component, a cellular telephone, a digital camera, a personal digital assistant (PDA), portable media (e.g., music) player, a Wi-Fi or cellular-enabled tablet such as, for example, an iPad® or SURFACE® tablet, an electronic book, a navigation device, etc. The electronic system 400 includes at least one memory device 402. The memory device 402 may comprise, for example, an embodiment of one or more of a microelectronic device structure (e.g., device structures 100, 100') and a microelectronic device (e.g., the memory device 300) previously described herein. The electronic system 400 may further include at least one electronic signal processor device 404 (often referred to as a "microprocessor"). The electronic signal processor device 404 may, optionally, include an embodiment of a microelectronic device structure (e.g., device structures 100, 100') and a microelectronic device (e.g., the memory device 300) previously described herein. The electronic system 400 may further include one or more input devices 406 for inputting information into the electronic system 400 by a user, such as, for example, a mouse or other pointing device, a keyboard, a touchpad, a button, or a control panel. The electronic system 400 may further include one or more output devices 408 for outputting information (e.g., visual or audio output) to a user such as, for example, a monitor, a display, a printer, an audio output jack, a speaker, etc. In some embodiments, the input device 406 and the output device 408 may comprise a single touchscreen device that can be used both to input information to the electronic system 400 and to output visual information to a user. The input device 406 and the output device 408 may communicate electrically with one or more of the memory device 402 and the electronic signal processor device 404.

Thus, an electronic system according to embodiments of the disclosure comprises an input device, an output device, a processor device operably coupled to the input device and the output device, and a memory device operably coupled to the processor device. The memory device comprises at least one elongate semiconductive pillar comprising a digit line contact region and storage node contact regions laterally flanking the digit line contact region. The at least one elongate semiconductive pillar also comprises an upper longitudinal portion and a longitudinal lower portion. The upper longitudinal portion of the at least one elongate semiconductive pillar has a greater critical dimension in at least one lateral direction relative to the lower longitudinal portion thereof.

The methods of the disclosure provide an effective and reliable way to manipulate the dimensions, shapes, and spacing of features (e.g., the pillar structures 104) of microelectronic device structures (e.g., the device structures 100, 100') of a microelectronic device (e.g., a memory device, such as a DRAM device). The methods facilitate simple and cost-effective formation and alignment of the digit line contacts and storage node contacts with reduced risk of shorts and junction leakage as compared to conventional methods of forming and aligning digit line contacts and storage node contacts for a microelectronic device structure. The methods of the disclosure may facilitate improved device performance, lower cost, increased miniaturization of components, improved pattern quality, and greater packaging density as compared to conventional methods of forming and aligning contacts (e.g., digit line contacts, storage node contacts) for a microelectronic device structure.

While the disclosure is susceptible to various modifications and alternative forms, specific embodiments have been shown by way of example in the drawings and have been described in detail herein. However, the disclosure is not intended to be limited to the particular forms disclosed. Rather, the disclosure is to cover all modifications, equivalents, and alternatives falling within the scope of the disclosure as defined by the following appended claims and their legal equivalents.

What is claimed is:

1. A method of forming an apparatus, comprising:
   forming access devices comprising pillar structures extending from a base material, upper portions of the pillar structures exhibiting a lateral width that is relatively greater than a lateral width of lower portions of the pillar structures;
   forming contact pads adjacent to the access devices;
   forming access lines laterally adjacent to the lower portions of the pillar structures;
   forming digit line contacts adjacent to the pillar structures; and
   forming digit lines over the digit line contacts.

2. The method of claim 1, wherein forming the access devices comprises forming the upper portions of the pillar structures in an initial material removal act and forming the lower portions of the pillar structures in one or more additional material removal acts.

3. The method of claim 1, wherein forming the access devices comprises:
   forming openings extending vertically between the pillar structures; and
   removing material from exposed side surfaces of the pillar structures.

4. The method of claim 3, wherein removing the material from the exposed side surfaces of the pillar structures comprises:
   forming a barrier material over upper surfaces of the pillar structures;
   forming a mask material over the barrier material; and
   forming a liner over upper surfaces of the mask material and along side surfaces of the mask material, the barrier material, and at least a portion of the pillar structures.

5. The method of claim 4, wherein removing the material from the exposed side surfaces of the pillar structures comprises removing exposed portions of the side surfaces of the pillar structures below a lowermost surface of the liner.

6. The method of claim 1, wherein forming the access devices comprises:
   forming the lower portions of the pillar structures in a first act; and
   forming the upper portions of the pillar structures over the lower portions thereof in a second, subsequent act.

7. The method of claim 6, wherein:
   forming the lower portions of the pillar structures comprises forming openings between adjacent pillar structures in a material removal act; and
   forming the upper portions of the pillar structures comprises forming a precursor material over exposed upper ends of the lower portions of the pillar structures and conducting a heat treatment act of the precursor material.

8. A method of forming an apparatus, comprising:
   forming pillar structures extending from a base material, upper portions of the pillar structures exhibiting a lateral width that is relatively greater than a lateral width of lower portions of the pillar structures;
   forming an isolation material substantially surrounding the pillar structures;
   forming access lines laterally adjacent to the lower portions of the pillar structures;
   recessing the isolation material to form contact openings to a first depth extending below a lowermost surface of the upper portions of the pillar structures;
   forming digit line contacts within the contact openings; and
   forming digit lines above upper surfaces of the pillar structures and the digit line contacts.

9. The method of claim 8, further comprising forming storage node contacts above respective pillar structures without electrically connecting neighboring pillar structures through the storage node contacts, wherein lowermost surfaces of the storage node contacts are formed at a second depth that is relatively less than the first depth of the contact openings, the storage node contacts remaining isolated from the lower portions of the pillar structures.

10. An apparatus, comprising:
a structure comprising:
a base material;
an access device recessed within the base material;
a contact pad adjacent to the access device, wherein the access device comprises an elongated pillar extending from the base material, the elongated pillar having an upper portion that is greater in width than a lower portion thereof; and
a digit line contact adjacent to the elongated pillar; and
digit lines extending in a first lateral direction, one of the digit lines being located over the digit line contact.

11. The apparatus of claim 10, further comprising buried word lines extending in a second lateral direction, substantially perpendicular to the first lateral direction, wherein two of the buried word lines intersect the elongated pillar, separating the elongated pillar into three portions including a digit line contact region and two storage node contact regions, the digit line contact located over the digit line contact region of the elongated pillar.

12. The apparatus of claim 11, wherein a longer side of the elongated pillar extends in a third lateral direction that is not perpendicular to either of the first lateral direction and the second lateral direction.

13. The apparatus of claim 11, wherein the structure comprises a storage node contact adjacent each of the two storage node contact regions of the elongated pillar, a lowermost surface of the storage node contact located in a plane that is vertically above a plane of a lowermost surface of the digit line contact.

14. The apparatus of claim 11, wherein the buried word lines are under upper surfaces of the elongated pillar with the buried word lines laterally adjacent to the lower portion of the elongated pillar, a vertical extent of the upper portion of the elongated pillar being relatively less than a vertical extent of the lower portion thereof.

15. The apparatus of claim 10, wherein the elongated pillar comprises an abrupt transition between the upper portion and the lower portion of the elongated pillar around an entire perimeter thereof, a cross-sectional area of the lower portion of the elongated pillar being between about 15 percent and about 75 percent of a cross-sectional area of the upper portion of the elongated pillar.

16. A memory device, comprising:
a memory controller;
a row decoder operably coupled to the memory controller;
a column decoder operably coupled to the memory controller;
word lines operably coupled to the row decoder;
digit lines operably coupled to the column decoder;
memory cells proximate intersections of the word lines and the digit lines, the memory cells comprising storage node structures and access devices electrically connected to the storage node structures; and
elongate semiconductive pillars operably coupled to the storage node structures of the memory cells and the digit lines, and each comprising:
storage node contact regions; and
a digit line contact region laterally between the storage node contact regions, wherein upper portions of the elongate semiconductive pillars comprise a cross-sectional area that is relatively greater than a cross-sectional area of lower portions thereof.

17. The memory device of claim 16, further comprising an isolation material between neighboring elongate semiconductive pillars, a lateral extent of the isolation material being relatively greater in a region laterally adjacent to the lower portions of the elongate semiconductive pillars than in another region laterally adjacent to the upper portions of the elongate semiconductive pillars.

18. The memory device of claim 16, wherein the elongate semiconductive pillars laterally extend at an acute angle offset from a direction in which each of the word lines and the digit lines laterally extend such that one of the storage node contact regions is laterally adjacent to the digit line contact region of a neighboring elongate semiconductive pillar.

19. The memory device of claim 16, wherein the memory device is a dynamic random access memory (DRAM) device comprising DRAM memory cells, a pitch between adjacent DRAM memory cells being between about 10 nm and about 20 nm.

20. The memory device of claim 16, further comprising:
storage node contacts at the storage node contact regions; and
redistribution structures operably coupled to and extending between the storage node contacts and the storage node structures, upper portions of the redistribution structures underlying the storage node structures and laterally offset from lower portions of the redistribution structures overlying the storage node contacts.

21. An electronic system, comprising:
an input device;
an output device;
a processor device operably coupled to the input device and the output device; and
a memory device operably coupled to the processor device and comprising at least one elongate semiconductive pillar comprising:
a digit line contact region; and
storage node contact regions laterally flanking the digit line contact region;
an upper longitudinal portion; and
a lower longitudinal portion, the upper longitudinal portion of the at least one elongate semiconductive pillar having a greater critical dimension in at least one lateral direction relative to the lower longitudinal portion thereof.

* * * * *

UNITED STATES PATENT AND TRADEMARK OFFICE
CERTIFICATE OF CORRECTION

PATENT NO. : 11,201,154 B2
APPLICATION NO. : 16/729076
DATED : December 14, 2021
INVENTOR(S) : Song Guo et al.

It is certified that error appears in the above-identified patent and that said Letters Patent is hereby corrected as shown below:

In the Specification

| | | |
|---|---|---|
| Column 5, | Line 14, | change "("SOT")" to --("SOI")-- |
| Column 8, | Line 6, | change "etching) processes" to --etching processes-- |
| Column 11, | Line 46, | change "silicon dioxide (Sift))," to --silicon dioxide (SiO₂)),-- |
| Column 18, | Line 21, | change "dielectric material" to --dielectric material.-- |

Signed and Sealed this
Twenty-second Day of February, 2022

Drew Hirshfeld
*Performing the Functions and Duties of the*
*Under Secretary of Commerce for Intellectual Property and*
*Director of the United States Patent and Trademark Office*